United States Patent
Pezeshki et al.

(10) Patent No.: US 10,782,472 B2
(45) Date of Patent: Sep. 22, 2020

(54) OPTICAL MODULE FOR TERABIT SWITCH

(71) Applicant: BROADEX TECHNOLOGIES UK LTD., Livingston (GB)

(72) Inventors: Bardia Pezeshki, Menlo Park, CA (US); Dinh Ton, Newark, CA (US); Susannah Heck, Edinburgh (GB); Gideon Yoffe, Newark, CA (US); Lucas Soldano, Milan (IT); Henk Bulthuis, Newark, CA (US); Suresh Rangarajan, Pleasanton, CA (US); Jamie Stokes, Linlithgow (GB); Ramsey Selim, Edinburgh (GB)

(73) Assignee: BROADEX TECHNOLOGIES UK LTD., Livingston (GB)

( * ) Notice: Subject to any disclaimer, the term of this patent is extended or adjusted under 35 U.S.C. 154(b) by 0 days.

(21) Appl. No.: 16/366,995

(22) Filed: Mar. 27, 2019

(65) Prior Publication Data

US 2020/0249395 A1 Aug. 6, 2020

Related U.S. Application Data

(63) Continuation of application No. 15/706,457, filed on Sep. 15, 2017, now abandoned.
(Continued)

(51) Int. Cl.
*G02B 6/12* (2006.01)
*H01S 5/022* (2006.01)
(Continued)

(52) U.S. Cl.
CPC ..... *G02B 6/12019* (2013.01); *G02B 6/12004* (2013.01); *G02B 6/3596* (2013.01); *G02B 6/3598* (2013.01); *G02B 6/4215* (2013.01);

*G02B 6/4292* (2013.01); *H01S 5/0085* (2013.01); *H01S 5/0265* (2013.01); *H01S 5/0268* (2013.01); *H01S 5/02248* (2013.01); *H01S 5/4025* (2013.01); *H01S 5/4087* (2013.01); *H04B 10/506* (2013.01);
(Continued)

(58) Field of Classification Search
CPC .............. G02B 6/12019; G02B 6/4292; G02B 6/12004; G02B 6/3598; G02B 6/3596; G02B 6/4215; H01S 5/0268; H01S 5/4025; H01S 5/0265; H01S 5/0085; H04B 10/506
See application file for complete search history.

(56) References Cited

U.S. PATENT DOCUMENTS 7,885,492 B2 2/2011 Welch et al.
8,346,037 B2 1/2013 Pezeshki et al.
(Continued)

OTHER PUBLICATIONS

International Search Report on related PCT Application No. PCT/US2017/052094 from International Searching Authority (KIPO) dated Jan. 15, 2018.
(Continued)

*Primary Examiner* — Ryan A Lepisto
(74) *Attorney, Agent, or Firm* — Haynes Beffel & Wolfeld LLP; Warren S. Wolfeld; Andrew L. Dunlap

(57) ABSTRACT

A switch module includes a switch integrated circuit (IC), a photonic integrated circuit (PIC), and a planar lightwave circuit (PLC). The PIC may include a plurality of light sources, an optical splitter, and a plurality of modulators. A dual MEMS may be used to align lens arrays, which may be used to couple light from the PIC to the PLC.

23 Claims, 30 Drawing Sheets

Related U.S. Application Data

(60) Provisional application No. 62/395,802, filed on Sep. 16, 2016.

(51) Int. Cl.
| | |
|---|---|
| *H01S 5/40* | (2006.01) |
| *H01S 5/026* | (2006.01) |
| *G02B 6/35* | (2006.01) |
| *G02B 6/42* | (2006.01) |
| *H04B 10/50* | (2013.01) |
| *H01S 5/00* | (2006.01) |
| *H04B 10/80* | (2013.01) |
| *G02B 6/38* | (2006.01) |
| *H01S 5/50* | (2006.01) |
| *G02B 6/36* | (2006.01) |

(52) U.S. Cl.
CPC ......... *H04B 10/801* (2013.01); *G02B 6/3672* (2013.01); *G02B 6/3885* (2013.01); *H01S 5/4012* (2013.01); *H01S 5/50* (2013.01)

(56) References Cited

U.S. PATENT DOCUMENTS

| | | |
|---|---|---|
| 8,368,995 B2 | 2/2013 | Dallesasse et al. |
| 2003/0063836 A1 | 4/2003 | Lam et al. |
| 2003/0214698 A1 | 11/2003 | Ohara et al. |
| 2005/0129404 A1 | 6/2005 | Kim et al. |
| 2014/0185978 A1 | 7/2014 | Liao et al. |
| 2015/0271576 A1 | 9/2015 | Svilans et al. |
| 2016/0149662 A1 | 5/2016 | Soldano et al. |
| 2016/0161685 A1 | 6/2016 | Xu et al. |
| 2017/0139145 A1 | 5/2017 | Heanue et al. |

OTHER PUBLICATIONS

Written Opinion on related PCT Application No. PCT/US2017/052094 from International Searching Authority (KIPO) dated Jan. 15, 2018.

U.S. Appl. No. 15/706,457, filed Sep. 15, 2017, Bardia Pezeshki, Dinh Ton, Susannah Heck, Gideon Yoffe, Lucas Soldano, Henk Bulthuis, Suresh Rangarajan, Jamie Stokes, Ramsey Selim, US 2018-0083417 A1, Office Action dated May 9, 2018, dated Jul. 27, 2018, Notice of Allowance dated Dec. 27, 2018.

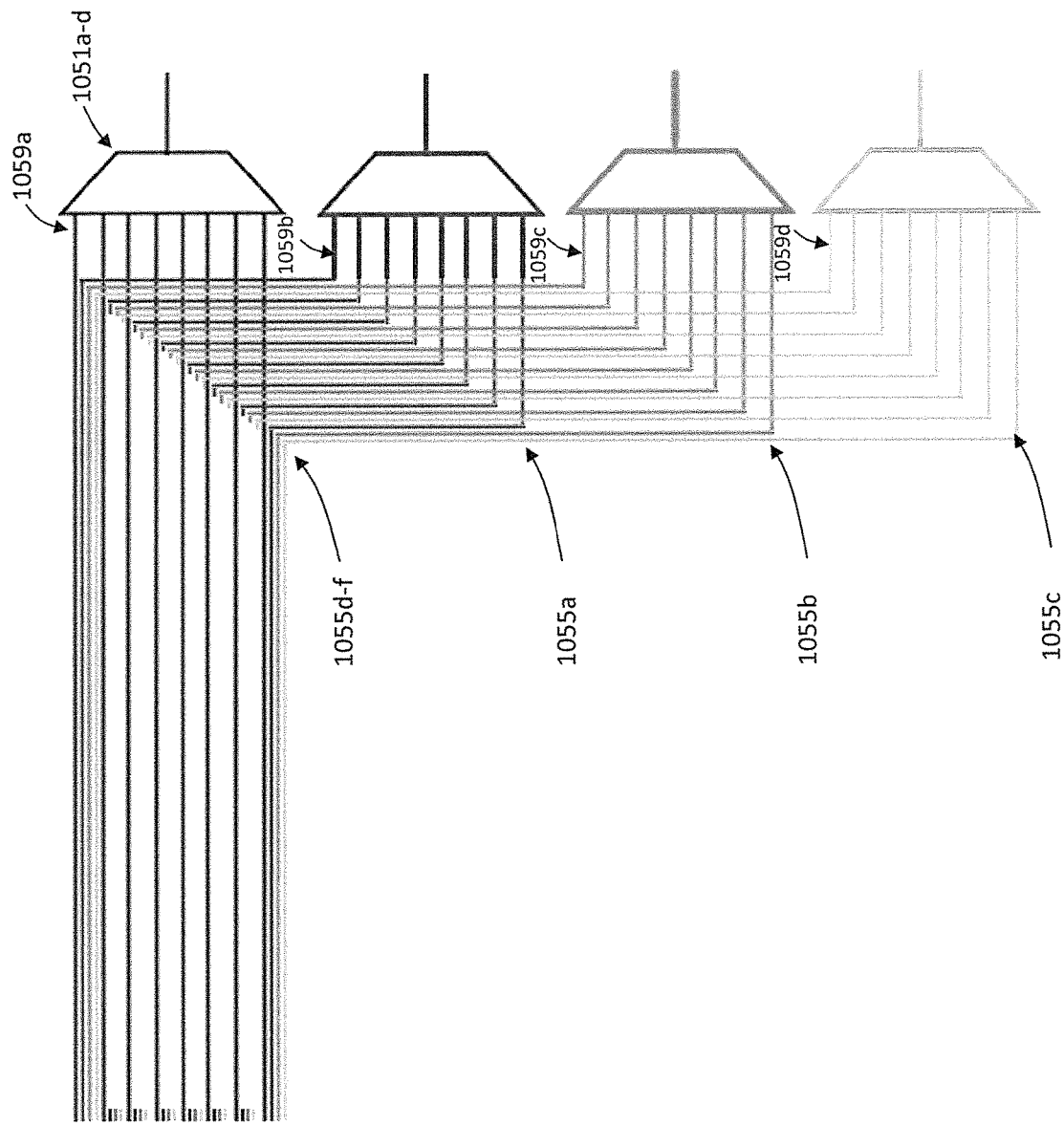

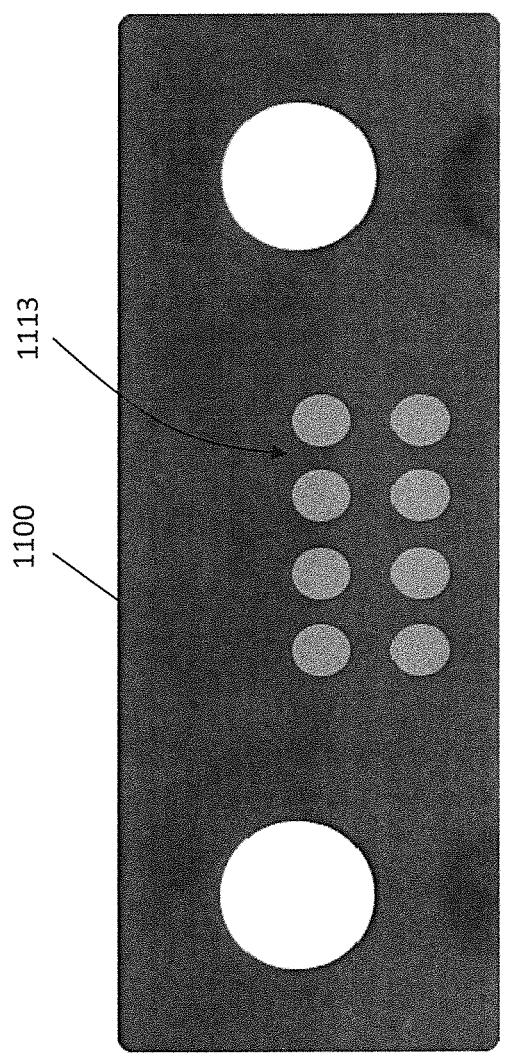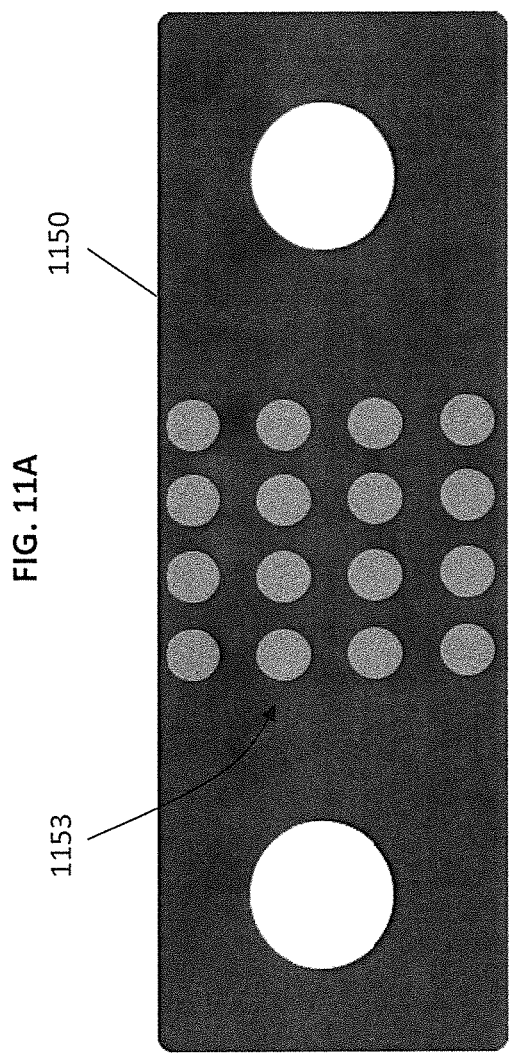
FIG. 11A
FIG. 11B

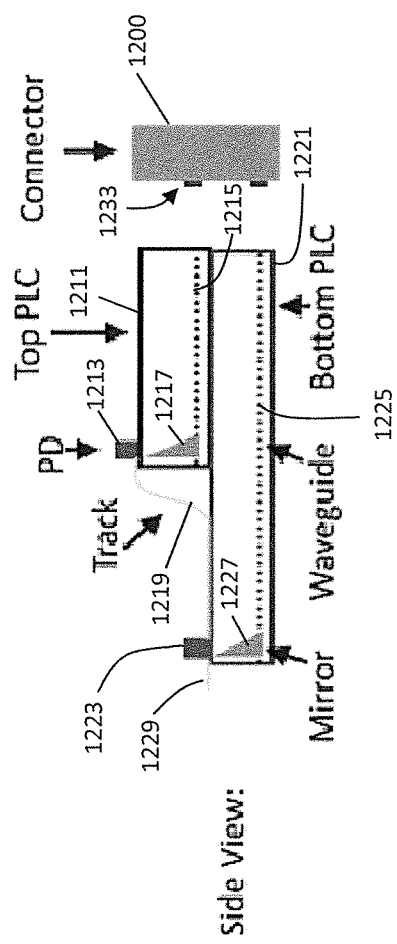
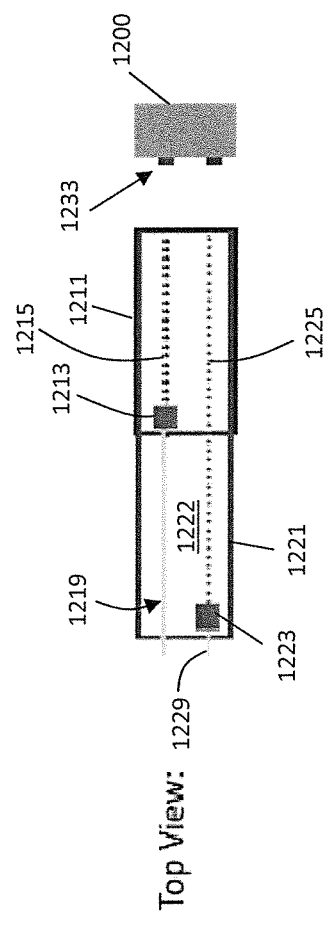
FIG. 12A
FIG. 12B

OPTICAL MODULE FOR TERABIT SWITCH

CROSS-REFERENCE TO RELATED APPLICATIONS

This application is a continuation of U.S. patent application Ser. No. 15/706,457, filed Sep. 15, 2017, which claims the benefit of the filing date of U.S. Provisional Patent Application No. 62/395,802, filed on Sep. 16, 2016, the disclosures of which are incorporated by reference herein.

BACKGROUND OF THE INVENTION

The present application relates generally to fiber optic communications and more particularly to switching devices having fiber optic connections.

Much of our cloud based infrastructure is based on storage and processing of data by large numbers of servers in data centers. These servers are connected through a switch network in various configurations. A typical topology might be large groups of 96 servers in a rack connected to a top of rack (TOR) switch. These TOR switches are connected to an aggregation or leaf switch, which in turn is connected to a spine switch. The spine switches are interconnected to form a huge network where every server can connect with every other up and down various links in the system. Generally, with current technology, the servers are connected to the top of rack switch with 10 Gb/s Ethernet copper links, while the spine switches are connected to each other with 40 Gb/s or 100 Gb/s fiber optics. As datacenters are becoming larger and speeds are increasing, there is a trend in interconnects from active optical cable and multimode fiber to single mode fiber that has higher performance.

The switch modules themselves are relatively simple in principle. At their core there is one or more high speed switch ICs that move packets of data based on then address from one lane to another. The latest generation high performance switch ICs may have 128 lanes of 25 Gb/s in each lane, composing 3.2 Tb of data flowing in and out of a central switch IC. Data enters and exits the switch modules through a front panel via optical transceivers, with typically each fiber carrying 40 Gb/s or 100 Gb/s in 4 wavelength lanes of 4×10 Gb/s or 4×25 Gb/s. These transceivers generate or receive optical signals, and, especially those running at higher speeds, may include clock and data recovery (CDR) circuits that regenerate the signals. The transceivers are connected to the central switch IC using electrical links that are routed on a main board and up into an electronics package of the switch IC. Since high speed signals degrade rapidly during only a few inches of travel, CDRs may be used repeatedly in electrical interconnects. The switch chip itself generally includes CDRs as well. Moreover, the CDRs may also require use of equalization circuits to provide signal conditioning prior to clock and/or data recovery. Given the large number of lanes, the interconnect density and power consumption of the module can be a bottleneck to the system.

As the switch ICs improve in performance, the switch modules are even more limited by the constraints of the architecture. Current switch ICs 3.2 Tb, with 128 lanes of 25 Gb/s may double to 6.4 Tb/s, 256 lanes of 25 Gb/s, that may in turn double to 12.8 Tb/s or 256 lanes of 50 Gb/s, presumably each 50 Gb/s lane actually running at 25 GBd but using advanced PAM4 modulation that doubles the bit rate. As the number of lanes and modulation speeds increase, generally so does a need for equalization and power consumption and dense co-packaged products.

Accordingly, the conventional switch is seriously limited by the architecture of a central switch IC connected to optical transceivers in the front panel, and the constraints are increasing with newer generations of switches. These constraints may include:
  Cost of the optical transceivers.
  Power consumption, where perhaps 30%-50% of the total power is expended in equalizing/regenerating electrical signals as data is transferred back and forth from the switch IC and in/out of the transceivers. A considerable amount of power may be consumed by the optical transceivers on the front panel, where airflow is often restricted.
  Panel density—the size of the transceivers is such that a limited number of them can be placed on the front panel and thus only a limited bandwidth out of the front panel of the switch.

BRIEF SUMMARY OF THE INVENTION

Aspects of the invention provide a switch module comprising: a switch integrated circuit (IC) chip including a device for routing inputs to outputs of the switch IC chip; at least one photonic integrated circuit (PIC) comprising: a plurality of light sources for providing light; an optical splitter having a plurality of inputs and outputs and for use in splitting the light provided by each of the plurality of light sources; and a plurality of modulators for modulating light received from the plurality of outputs of the optical splitter and for providing modulated optical signals; at least one planar lightwave circuit (PLC) optically coupled to one or more PIC(s) and positioned to receive and combine the modulated optical signals into an optical output; wherein outputs of the switch IC chip coupled to the plurality of optical outputs. On the receiver side the module comprises of fibre coupling light to at least one PLC that demultiplexes the light, which is then detected by photodetectors that may be mounted on the PLC above turning mirrors. Alternatively the photodetectors may be located such that they receive light from the edge of the PLC.

Aspects of the invention provide a switch module comprising: a plurality of photonic integrated circuit (PICs), each of the PICs comprising a plurality of light sources for generating light, an optical splitter having inputs and outputs and configured to split light generated by each of the plurality of light sources, and a plurality of modulators, with each of the plurality of modulators configured to modulate light provided by one of the outputs of the optical splitter and to generate a modulated optical signal; a plurality of planar lightwave circuits (PLCs), that may or may not be stacked, optically coupled to the PICs and configured to combine modulated optical signals from the plurality of modulators into an optical signal.

These and other aspects of the invention are more fully comprehended upon review of this disclosure.

BRIEF DESCRIPTION OF THE FIGURES

Aspects of the disclosure are illustrated by way of examples.

FIGS. 10A-B illustrate examples of multiplexer routing in accordance with aspects of the invention.

FIGS. 11A-B illustrate cross sectional examples of an optical connector for coupling optical fibers to PLCs in accordance with aspects of the invention.

FIGS. 12A-D illustrate side and top views of two vertically stacked or double stacked PLCs coupled to an optical connector in accordance with aspects of the invention.

DETAILED DESCRIPTION

Figure 1:
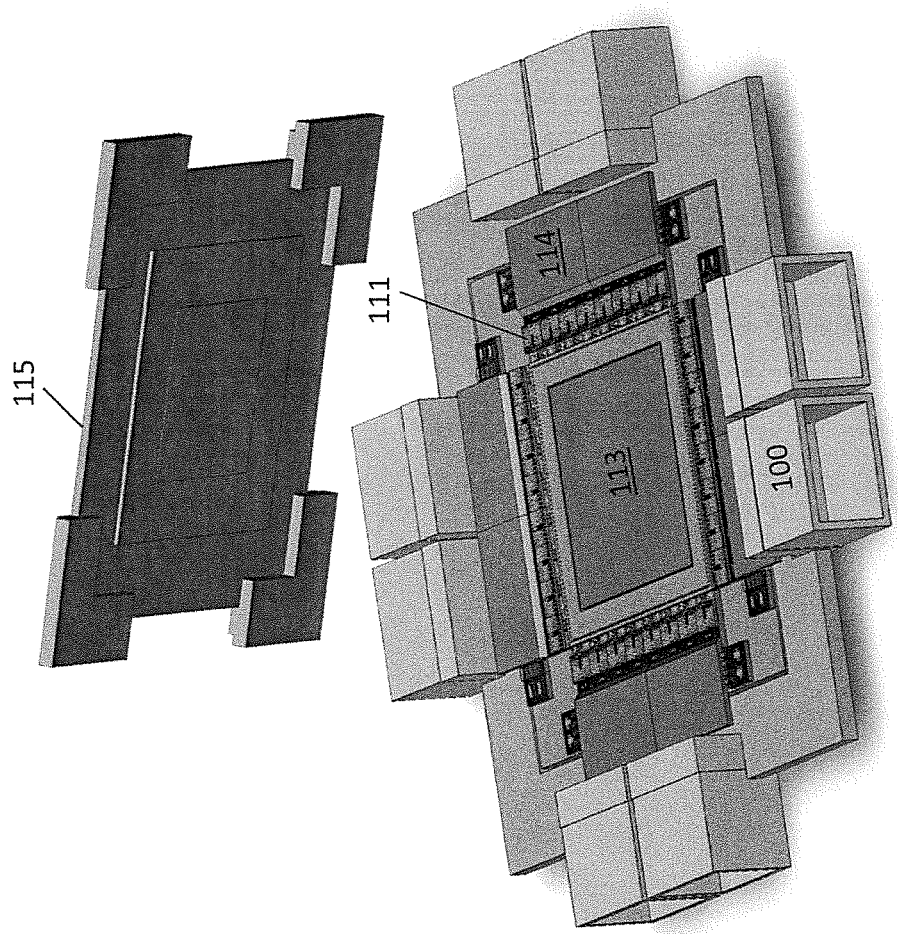
FIG. 1 shows a switch module including 8 optical modules, each running with 4 transmit fibers and 4 receive fibers, each module with 400 Gb/s, packaged together with the switch IC 113.

FIG. 1 shows a switch module in accordance with aspects of the invention. The switch module may perform, for example, routing of data between servers in a data center. The switch module includes a switch integrated circuit (IC) 113. The switch IC routes data between inputs and outputs of the switch IC. The switch IC, and specifically the inputs and outputs of the switch IC, are coupled to a plurality of optical modules. The optical modules comprise an optical assembly 111, a PLC 114, and, only in some embodiments and as illustrated in FIG. 1, a connector for coupling optical fiber lines. The optical assemblies in some embodiments comprise a PIC and a MEMS. The optical assemblies convert outgoing data from the switch IC from electrical signals to optical signals, and convert incoming data to the switch from optical signals to electrical signals. Each optical assembly is coupled to a corresponding PLC 114, with the PLCs in turn coupled to corresponding MTP connectors 100. Each PLC routes optical signals between the optical assemblies and fiber optic lines of the MTP connectors. Each of the MTP connectors provides for coupling of the fiber optic lines, for example to a switch front panel. In some embodiments the switch IC, the optical assemblies, and the PLCs are commonly coupled to an underlying substrate, or for example a common baseplate, which may be a metallic heatsink. The front panel of the switch module may be simply a patch panel, for example either with MTP connectors or broken up into 4 separate dual single mode fibers with potentially LC connectors.

The optical assemblies may include one or a plurality of light sources, for example as part of the PIC. The light sources may be for example edge emitting lasers, for example distributed feedback (DFB) lasers, suitable for greater than short reach transmission of wave division multiplexed (WDM) or dense WDM (DWDM), generally at a gigabit data rates. In various embodiments the lasers are driven as continuous wave (CW) lasers, with modulators, also part of the optical assembly, and in various embodiments also part of the PIC, used to impress data on light generated by the lasers. In some embodiments each optical assembly includes lasers for each of a plurality of different wavelengths, with in some embodiments redundant lasers being provided for some or all wavelengths. In addition, the optical assembly may include photodetectors, commonly paired with transimpedance amplifiers (TIAs) in some embodiments, for converting optical signals to electrical signals, although in various embodiments the photodetectors, and TIAs in some embodiments, may be mounted on the PLC instead. In various embodiments the optical assembly also includes a MEMS with, for example, one or more lenses or other device or construction for directing light from the PIC into the PLC. The PIC and the MEMS may be on or of a common substrate, with in some embodiments the MEMS being formed of material of the substrate.

In the embodiment of FIG. 1, eight optical assemblies are provided, along with eight corresponding PLCs and eight corresponding MTP connectors. In some embodiments, each of the MTP connectors, has at least 4 transmit fibers and 4 receive fibers, each fiber carrying 8×50 Gb/s either in or out. Each of the OSAs therefore provides 1.6 Tb/s input and 1.6 Tb/s output to the switch IC. Even though there are 32 input and 32 output fibers, each fiber containing 8 wavelength channels, each optical assembly may include only 8 lasers, one of each of 8 different wavelengths. The lasers are separated somewhat from the switch IC, and may heatsink to a metallic base plate of the switch module or, if provided, another base plate. A metallic cover 115 of the switch module also helps spread the heat, such that the heat from the switch IC is dissipated and the lasers stay relatively cool. Given that the optical assemblies are physically very close to the switch IC, there is reduced need for equalization between the two. Thus CDRs for signals passed between the OSA and the switch IC in various embodiments may not include or have associated equalization circuits. The CDR can be lower performance than generally, or in some embodiments be switched off completely or omitted, and the overall power consumption is reduced, leading to less heating.

Figure 2:
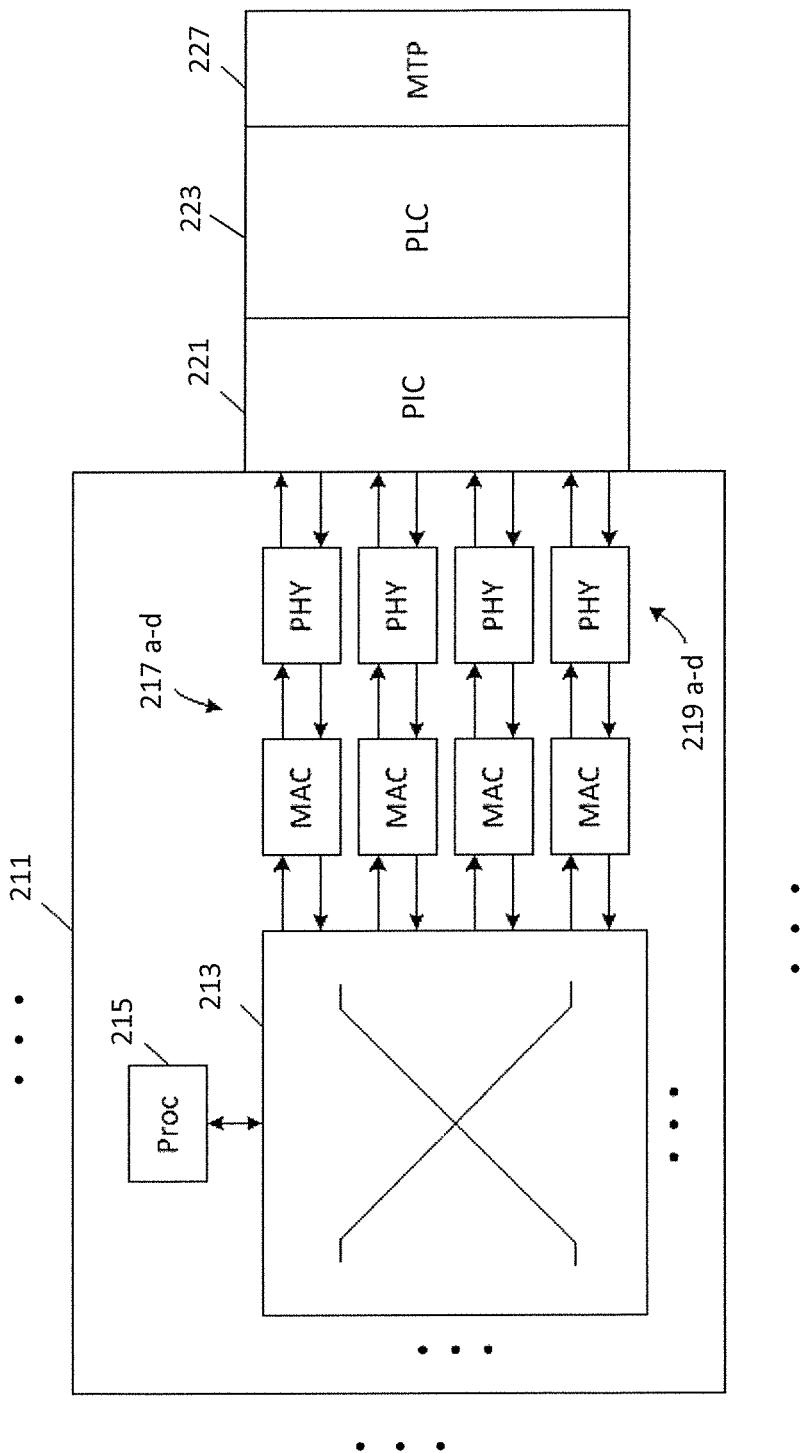
FIG. 2 is a block diagram of a switch module, explicitly showing only one of possibly a plurality of optical modules, which may include 8 of these modules in accordance with aspects of the invention.

FIG. 2 is a block diagram of a switch module in accordance with aspects of the invention with only one set of optical module elements, comprised of an optical assembly, and a PLC, along with a connector, as illustrated. In FIG. 2 the connector is an MTP connector, although in various embodiments other connectors may be used. The switch module includes a switch IC chip 211, a photonic integrated circuit (PIC) 221, and a planar lightwave circuit (PLC) 223. A connector 227 is coupled to the PLC for fiber optic lines. The switch IC chip and the PIC are electrically coupled so as to pass electrical data between themselves, while the PIC and PLC are generally configured to pass optical data between themselves. For each optical module, which comprised of an optical assembly and PLC, multiple PICs and/or multiple PLCs may be provided.

In operation, the switch module receives and transmits optical data over the fiber optic lines. The received optical data is provided to the PIC by the PLC, with the PIC converting the received optical data to received electrical data, for example using photodiodes and associated circuitry. The received electrical data is passed to the switch IC chip, which determines routing of the data, which may include routing of at least some of the data back to the PIC as electrical data for transmission. The PIC converts the electrical data for transmission to optical data for transmission, for example using lasers, and modulators in embodiments in which the lasers are operated as continuous wave (CW) lasers. The optical data for transmission is passed through the PLC to the connector 227, and sent over the fiber optic lines. The PIC could include both transmit and receive functions, as described above, or only include one of the two, with discrete elements used for the other function.

The switch IC chip includes a switch 213, which routes data between switch inputs and switch outputs. The routing of the data is generally controlled by a switch IC chip processor 215, which for example may utilize information of the data, for example in packet headers, as well as routing table maintained by the processor in determining routing of the data between switch inputs and switch outputs.

As illustrated in FIG. 2, four transmit/receive chains are shown as coupled to the switch 213. In most embodiments, however, many more transmit/receive chains would be coupled to the switch. Similarly, although each transmit/receive chain is shown as including Media Access Control (MAC) circuitry 217a-d and physical layer (PHY) circuitry 219a-d, in various embodiments various buffers, priority queues, and other circuitry may be interposed between the MAC circuitry and the switch.

Also as illustrated in FIG. 2, only a single PIC and PLC are explicitly shown, with the four illustrated transmit/receive chains of the switch IC chip providing data to and receiving data from the PIC. In most embodiments, however, additional PIC and PLC would also be provided.

The switch module itself, in many embodiments, would be within an enclosure, which would also generally include power supplies, cooling fans, potentially a CPU module, and possibly other items. A front panel of the enclosure may also provide connectors for fiber optic lines. In general, however, the front panel would not be equipped with optical transceivers, as the PIC, and in some embodiments the PIC and PLC, may be considered as generally performing functions which would otherwise be performed by the optical transceivers.

Figure 3A:
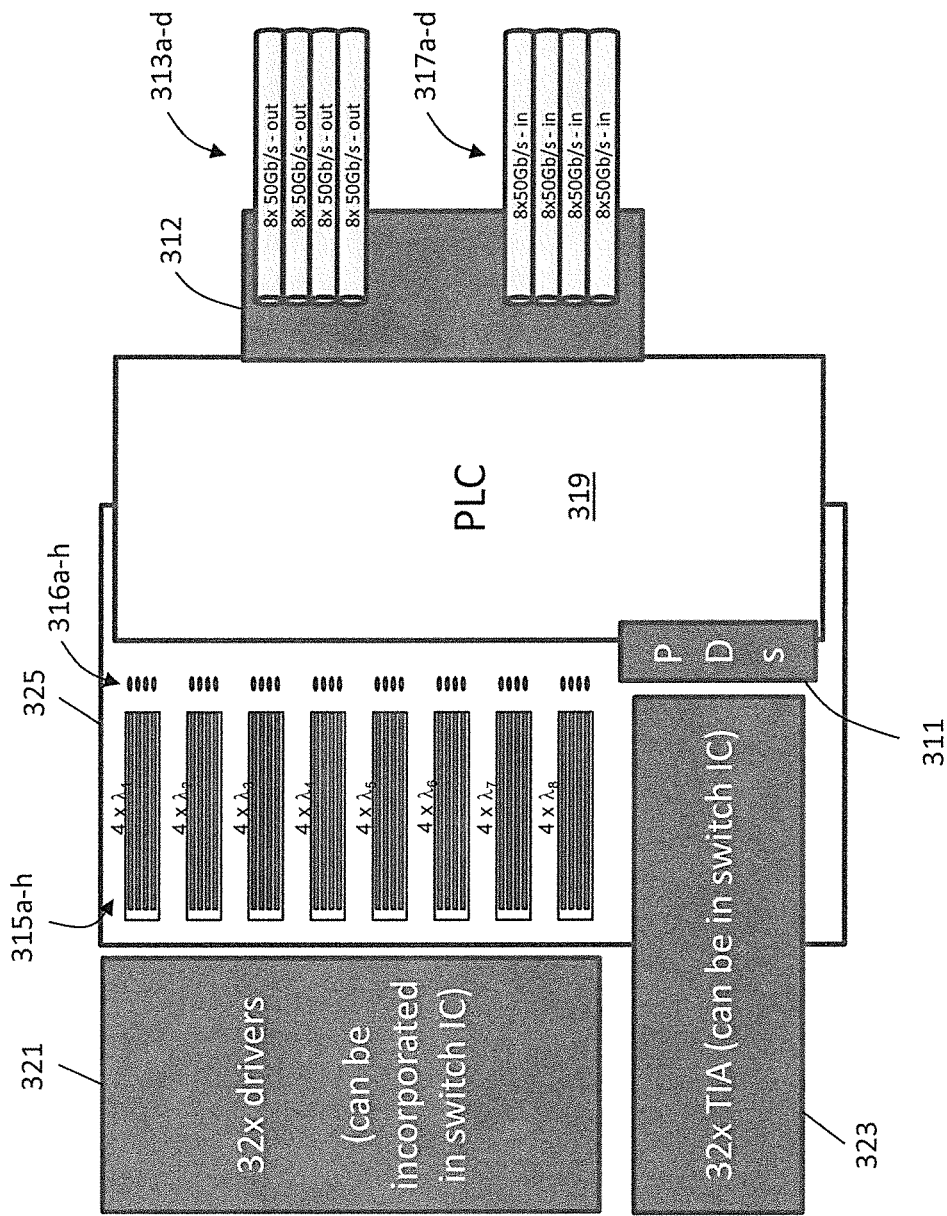
FIG. 3A shows a schematic of a 1.6 Tb/s optical module of a further architecture in accordance with aspects of the invention.

FIG. 3A shows a block diagram of portions of a further architecture including an optical module in accordance with aspects of the invention. The architecture of such an optical module, for example, may be a 1.6 Tb/s architecture, with 32 channels each running at 50 Gb/s. Referring to FIG. 3A, the architecture may include a chip 325 (e.g., an InP chip) having light sources 315a-h, for example eight light sources each of a different wavelength. In various embodiments redundant light sources may also be provided. For example, to generate the eight wavelengths, there may be four light sources for each wavelength, and the light sources may be on the same monolithic InP die, or separate InP die may be provided for light sources for a particular wavelength channel. In some embodiments, the light sources are directly modulated single mode lasers, for example DFB lasers, driven by driver circuitry 321. In most embodiments, however, the lasers are CW lasers integrated with modulator arrays. The modulator arrays would modulate the light from the lasers based on electrical signals received from the driver circuitry 321. In the embodiment of FIG. 3A, each wavelength PIC 315a, . . . 315h, includes four modulators, allowing for four data signals of the same wavelength for each light source. In some embodiments, the light sources are coupled to the modulators by splitters. In some embodiments the driver circuitry is incorporated or integrated into a switch IC (not shown).

Optical signals from each of the lasers/modulator arrays are passed to a PLC 319. In some embodiments, and as illustrated in FIG. 3A, the optical signals are passed to the PLC by arrays of lenses 316a-h. The array of lenses may be positioned on movable MEMS platforms, which may be locked into place once the lenses are positioned so as to pass light from the lasers or modulators into the PLC. The PLC may include multiplexers, for example transmit arrayed waveguide gratings (AWGs) (not shown), that multiplex the light from each single wavelength output modulator into multiplexers, for example four outputs, provided to transmit fibers 313a-d, for example an MTP connector 312. In some embodiments each of the transmit fibers carries 400 Gb/s, with eight wavelengths at 50 Gb/s each in each fiber.

Input data may come in wavelength lanes through input fibers 317a-d. In some embodiments each of the input fibers carries 400 Gb/s, with eight wavelengths at 50 Gb/s each, in each fiber. Light from the input fibers, in some embodiments, is demultiplexed by the PLC into separate waveguides, for example 32 waveguides, for separate wavelengths. In some embodiments the demultiplexers are in the form of receive AWGs. The demultiplexed light is received by photodetectors 311 coupled to the PLC, with the photodetectors providing electrical signals. The electrical signals are amplified by transimpedance amplifiers (TIAs) 323. In some embodiments the TIAs are also integrated into the switch IC (not shown), although perhaps more commonly the TIAs are co-packaged with the photodetectors.

Figure 3B:
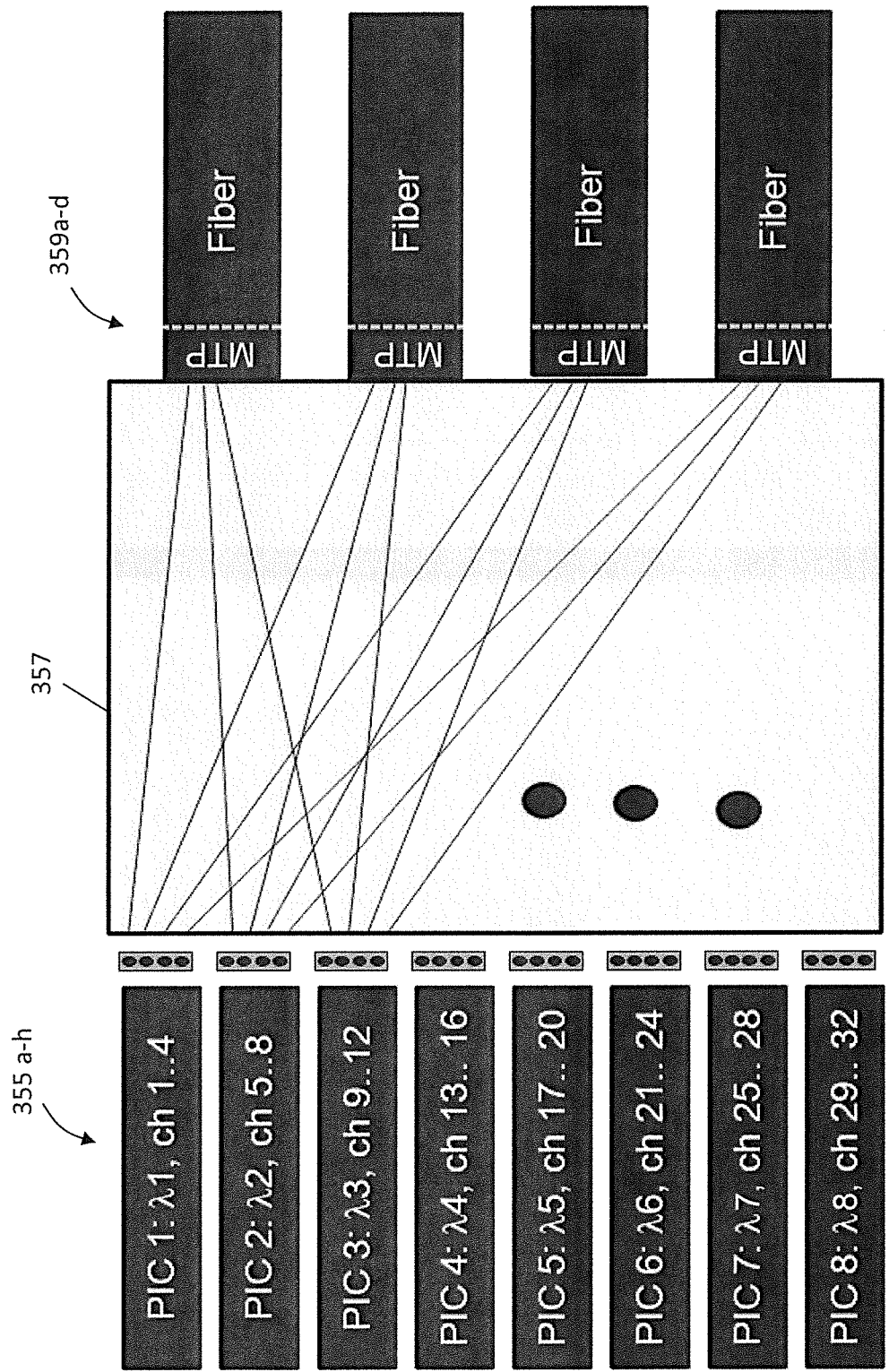
FIG. 3B is a diagram of an architecture having eight PICs that each provide four channels of transmission in accordance with aspects of the invention.

FIG. 3B is a diagram of an architecture for the transmit side only of the optical module. In this architecture the optical module has 8 PICs that each provide four channels of transmission in accordance with aspects of the invention. Referring to FIG. 3B, the architecture includes PICs 355a-h, a PLC 357, and transmit fibers 359a-d, which may or may not use MTP connectors. Each of the PICs provides four channels of modulated data of a single wavelength. In some embodiments the four channels of data are provided using four lasers for each PIC, each of the same wavelength, and which may be directly modulated. In many embodiments, however, light from a single laser (or multiple lasers in some embodiments), is split using optical splitters and provided to four separate modulators. In some such embodiments, redundant lasers may also be provided, with all of the lasers of a PIC coupled to modulators of the PIC by way of optical splitters.

Modulated light from each of the PICs are passed to the PLC. For example, a single laser may be used to provide light to four modulators, and, upon failure of that laser, a redundant laser of the PIC may instead be used. The PLC in turn passes the light to the corresponding fibers, such that each fiber receives modulated light of each wavelength. The PLC may include transmit AWGs for multiplexing the light into outputs provided to the transmit fibers. In some embodiments, each of the transmit fibers provides eight wavelengths of 50 Gb/s transmission at each wavelength. In some embodiments, each of the PICs includes four single mode lasers optically coupled to a passive optical component (e.g., a star coupler or multimode interference (MMI) coupler), with the passive optical component being optically coupled to four Mach-Zehnder modulators.

Figure 4A:
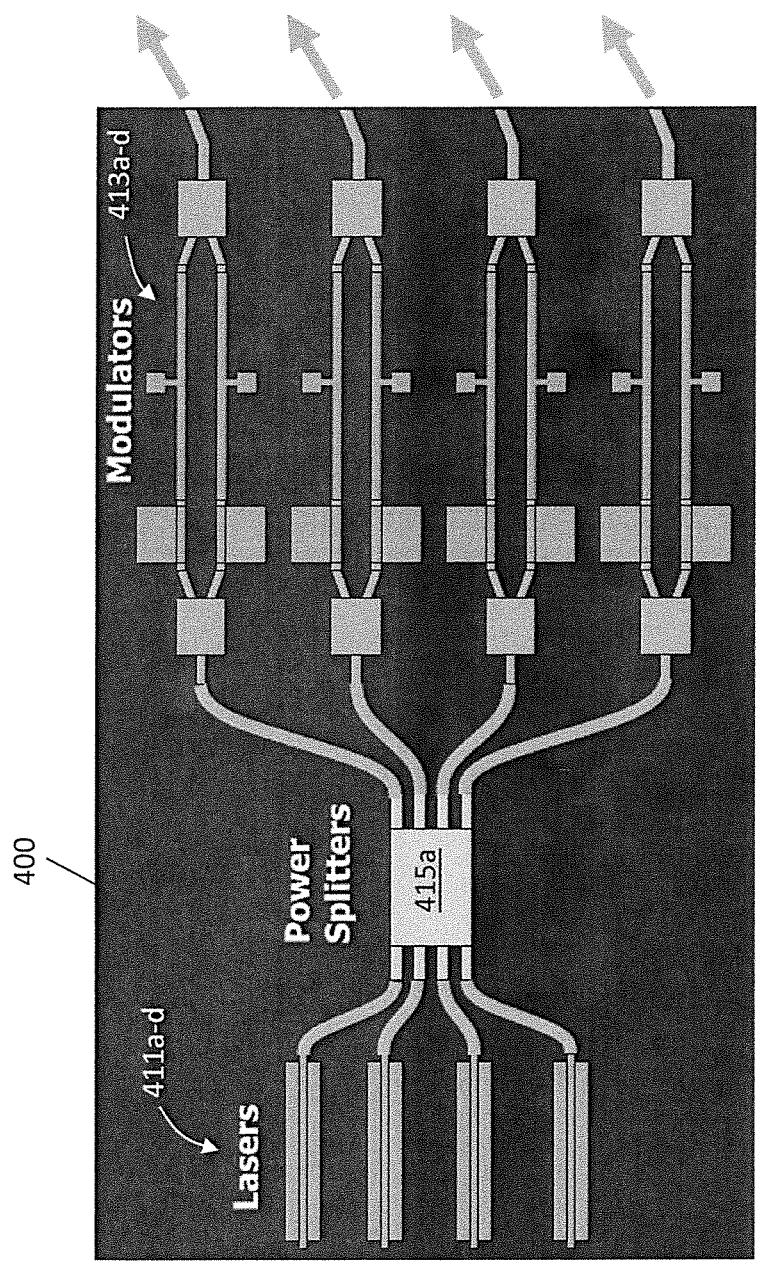
FIGS. 4A-4L are diagrams of light sources integrated with modulators, and various optical power splitting arrangements, on a PIC in accordance with aspects of the invention.

FIGS. 4A-4L are diagrams of light sources integrated with modulators on a PIC in accordance with aspects of the invention. In some embodiments the light sources integrated with modulators are used in the PICs of FIGS. 2 and 3A-B. As shown in FIG. 4A, a PIC 400 (e.g., InP chip) includes light sources 411a-d, which may include InP lasers in some embodiments, and modulators 413a-d (e.g., Mach-Zehnder modulators). In some embodiments, each of the modulators may provide a 50 Gb/s PAM4 optical signal. In some embodiments, there may be eight of these PICs in an architecture to provide for 32 wavelengths, for example, as shown in FIGS. 3A and 3B.

Figure 4B:
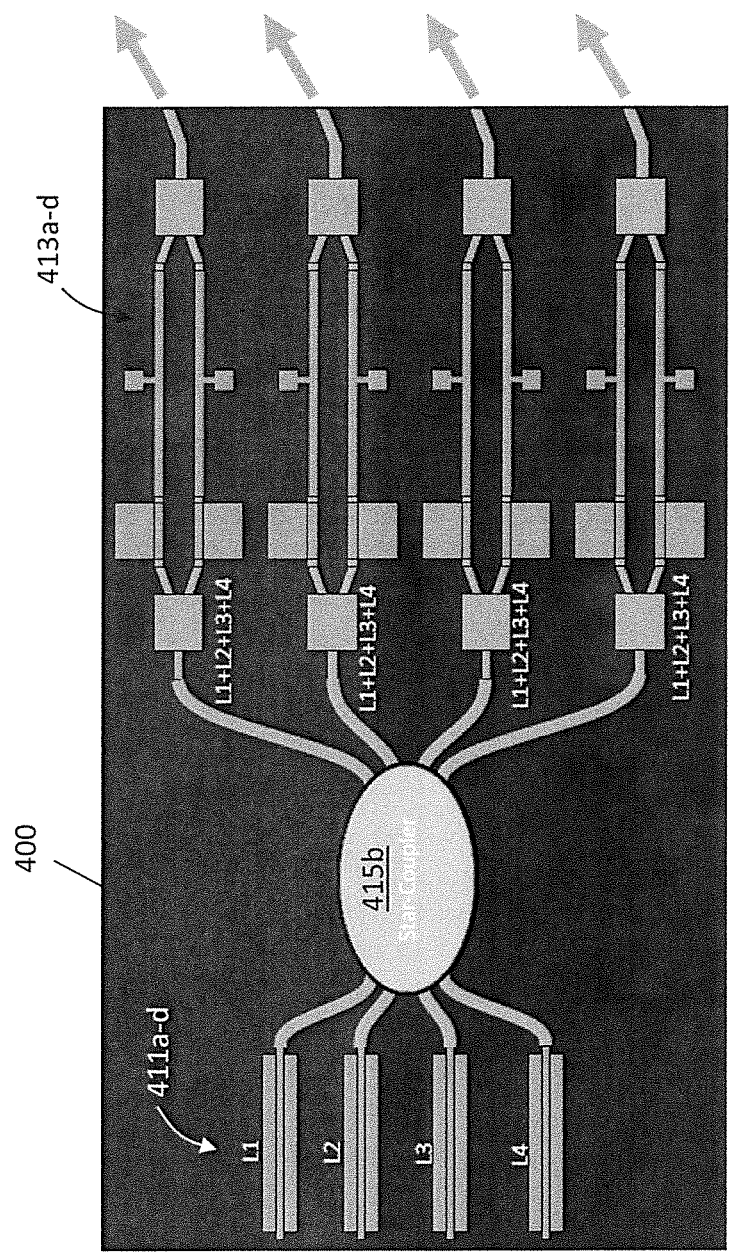
Figure 4C:
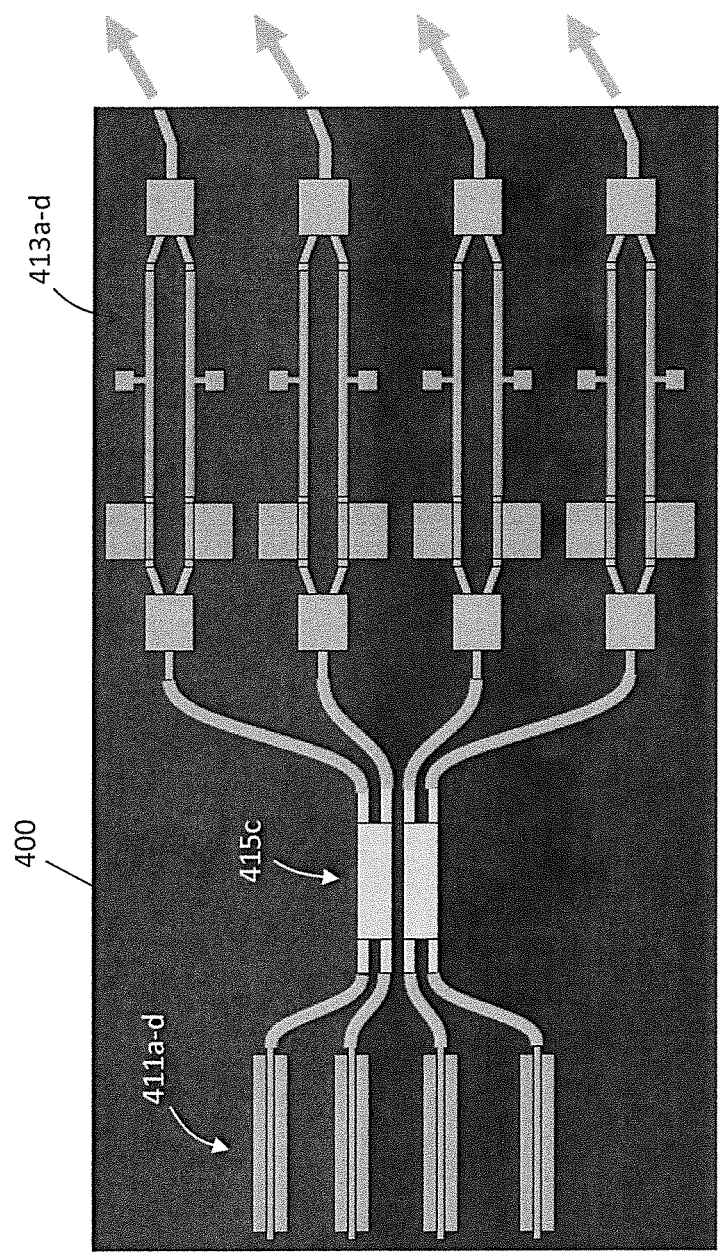
Figure 4D:
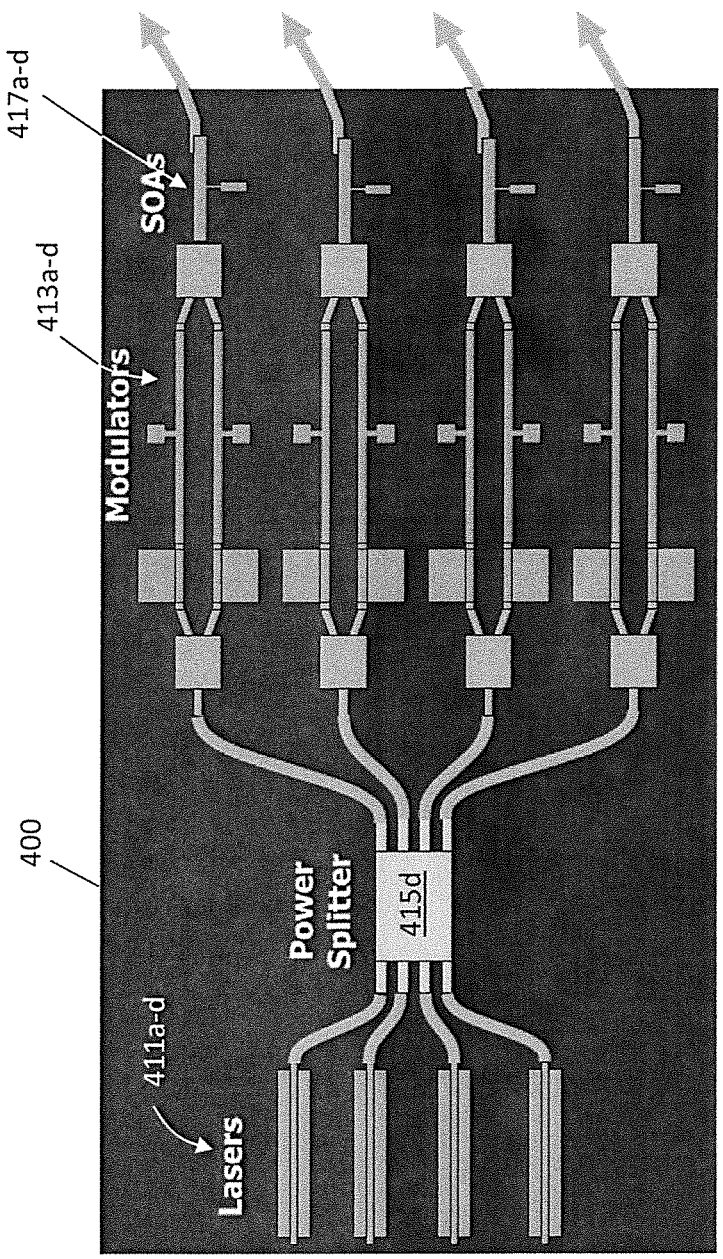
Figure 4E:
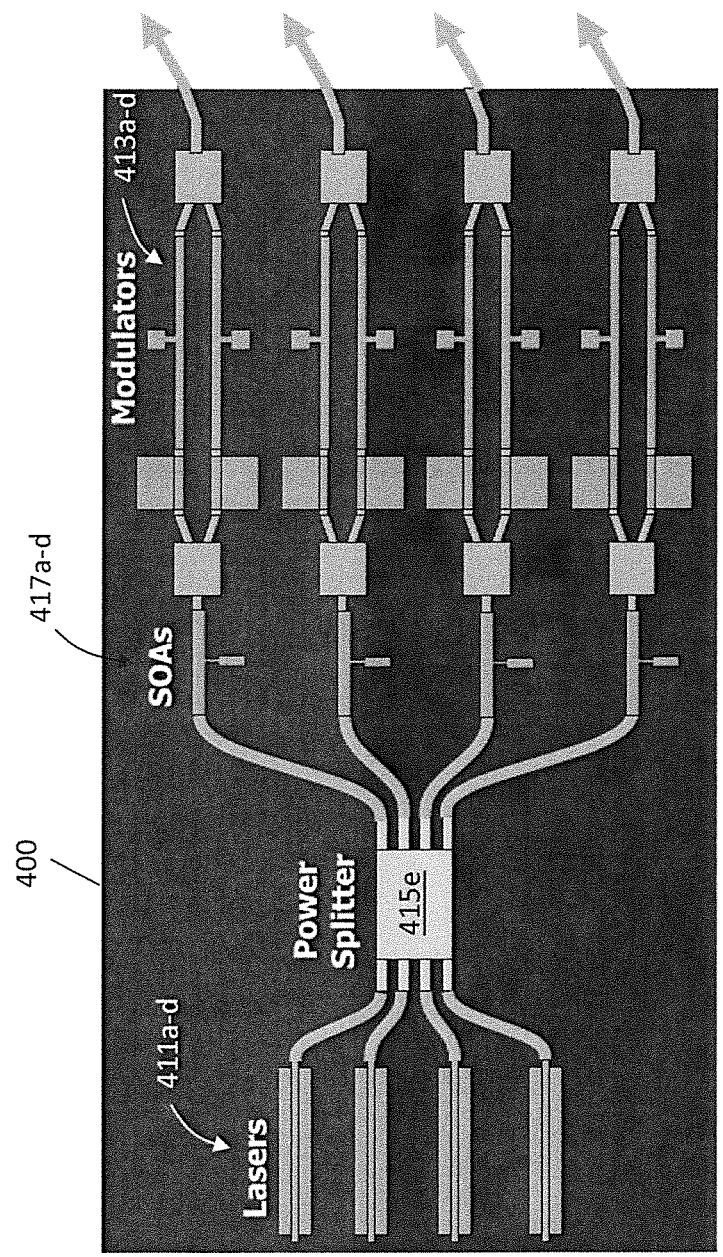
Figure 4F:
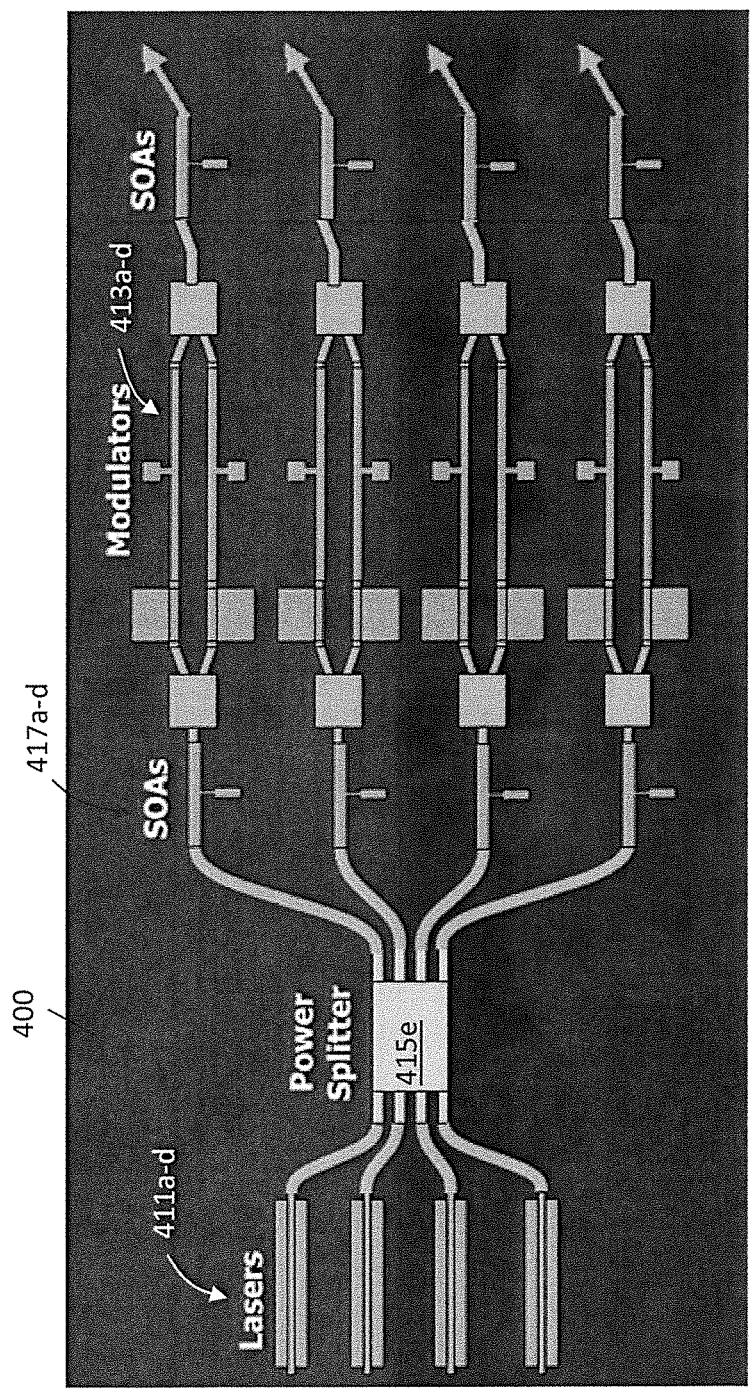
Figure 4G:
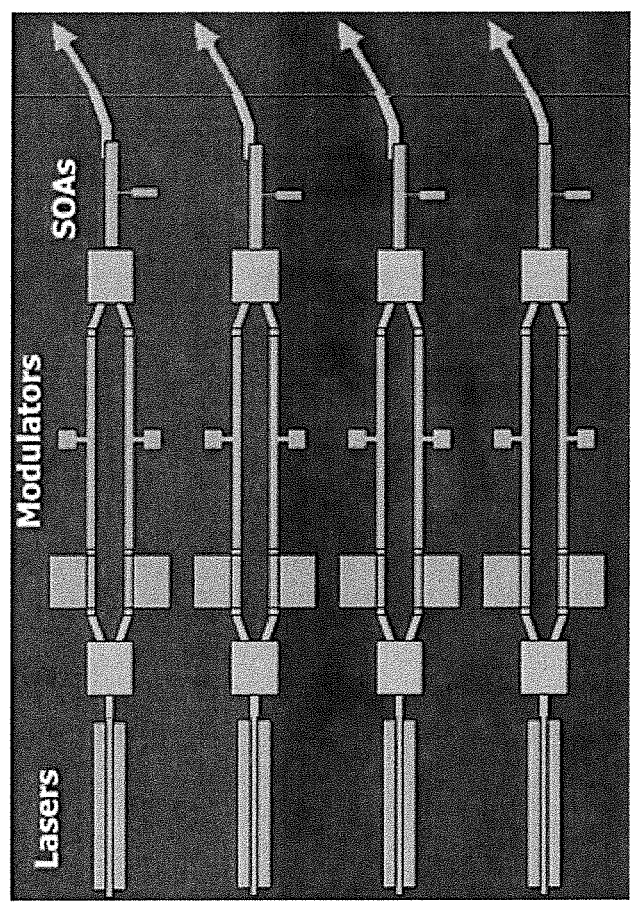

Although there are four light sources shown in FIG. 4G along with four modulators, each modulator may not have a dedicated light source. For example the four light sources may provide light to the modulators through a splitter 415a. In some embodiments, the splitter 415 comprises a passive optical component such as a 4×4 MMI coupler. In some embodiments, at any given time, only one of the four light sources is activated and the light from that single light source is split into four by the splitter and illuminates all four of the modulators. In various embodiments, compared to a structure where four light sources are illuminated simultaneously, where FIG. 4G shows the baseline module where each modulator is powered by an individual laser. FIGS. 4A-F have multiple lasers thereby increasing reliability, in some configurations up to 4× reliability. For example, it is more likely for the one light source to fail than it is for a set of four light sources to all fail.

In some embodiments, the light sources may draw higher power to allow for 4× splitting into the modulators. For example, light from all of the light sources, as activated, may go into the splitter, however one may only activate one laser at a time. If one of the light sources fails, there are three spare backup light sources that may be activated in turn. The splitter has the same loss, for example, as a 1×4 splitter, as a 4×4 splitter, so adding three extra light sources to the input of the splitter has no drawbacks. In various embodiments, the cost may be minimal as there would be no increase in die size or extra lithography steps required. In some embodiments, in the case of silicon or external modulators that are not integrated with light sources, the same approach may be followed.

In some embodiments, the light sources may be designed to operate on different wavelengths. The wavelengths, for example, may vary with temperature (e.g., at about 0.1 nm per degree C.). With variation in the wavelengths, it may be possible to optimize different light sources for use at different operating temperatures so as to better match the characteristics of the modulators or a multiplexing PLC.

FIG. 4B shows a further embodiment of light sources integrated with modulators on a PIC in accordance with aspects of the invention. FIG. 4B, like FIG. 4A, includes a plurality of light sources 411a-d and a plurality of modulators 413a-d. In FIG. 4B, however, the light sources and modulators are coupled by a star coupler 415b.

FIG. 4C shows a further embodiment of light sources integrated with modulators on a PIC in accordance with aspects of the invention. In this case, each laser powers two modulators rather than four. The embodiment shown in FIG. 4D, with 2×2 MMI coupler 415c may require lower power but have lower redundancy. The figure shows a single PIC with two independent structures.

FIG. 4D shows a further embodiment of the light sources integrated with modulators on a PIC in accordance with aspects of the invention. This this case four lasers are integrated with a power splitter 415d and the modulators, this may require more power but has higher redundancy.

FIG. 4E shows a further embodiment of light sources integrated with modulators on a PIC in accordance with aspects of the invention. As shown in FIG. 4E, the PIC 400 (e.g., InP chip) includes the light sources 411a-d, splitter 415e, and modulators 413a-d as previously discussed. Additionally, the PIC 400 includes semiconductor optical amplifiers (SOAs) 417a-d in paths of the modulators. The paths of the modulators may include the SOAs, for example, to reduce power requirement of the lasers 411a-d. Accordingly, low power light sources may be used, and the SOAs may be used to boost light from the light sources to a required level. The SOAs for example may be used to tune optical power in each channel to a desired level, for example, to compensate for non-uniformity in the splitting ratios of the splitter. In some embodiments, the SOAs may be placed after the modulators (as shown in FIG. 4D). Alternatively, in some embodiments the SOAs may be placed before the modulators (as shown in FIG. 4E), for example, to eliminate any distortion of modulated signals by the SOAs. Alternatively, in some embodiments the SOAs may be placed before and after the modulators (as shown in FIG. 4F). In all cases, especially with the PICs that have SOAs on the output such as in FIG. 4D, one may use angled waveguides at a facet of the output of the PIC. This reduces the reflection from the facet into the structure and leads to greater stability. Lasers are sensitive to back reflections, so these reflections are preferably minimized in many embodiments, and this can be realized through a combination of techniques including angled facets and anti-reflection facet coatings.

Figure 4H:
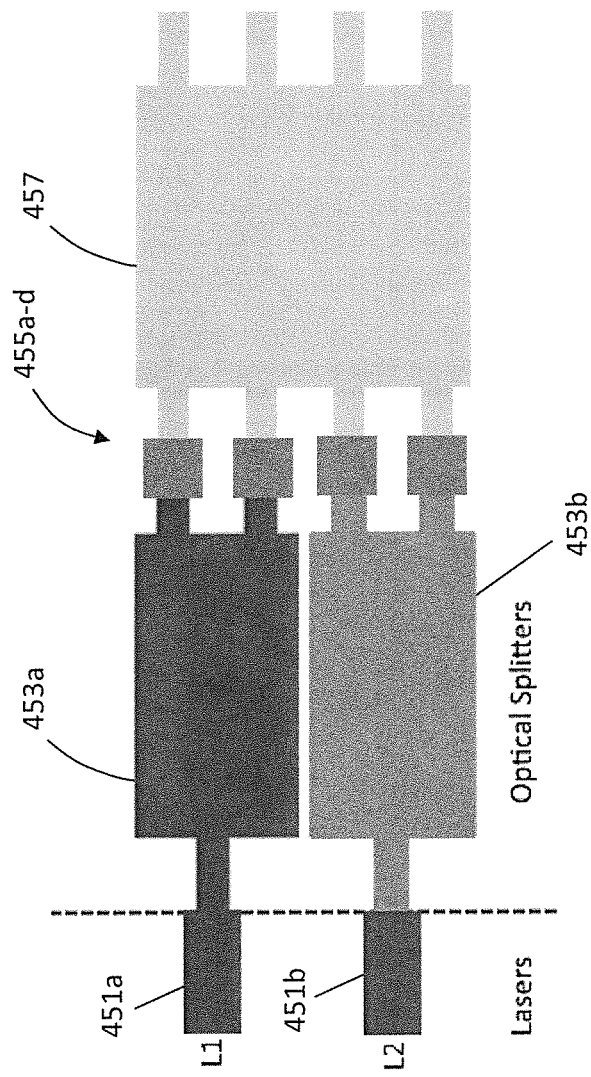

FIG. 4H schematically shows two lasers providing light through a plurality of splitters in accordance with aspects of the invention. In some embodiments the lasers and splitters may be used as the lasers and splitter or splitters as discussed elsewhere herein.

In FIG. 4H, a first laser 451a provides light to a first 1×2 optical power splitter 453a, and a second laser 451b provides light to a second 1×2 optical power splitter 453b. In various embodiments only one laser may be activated at a time. The 1×2 optical power splitters split optical power of light at their input between their outputs. Outputs of the 1×2 optical power splitters are provided to a 4×4 optical power splitter. In various embodiments the 1×2 optical power splitters and the 4×4 optical power splitter may be, for example, MMI couplers.

Tuning elements 455a-d are shown as interposed in optical pathways between the 1×2 optical power splitters and the 4×4 optical power splitter. The tuning elements may be used, individually or in pairs, for tuning a power splitting ratio between outputs of the optical splitters. Although the tuning elements are shown as interposed in the optical pathways between the splitters, in various embodiments the tuning elements may be part of the 4×4 optical power splitter.

Figure 4I:
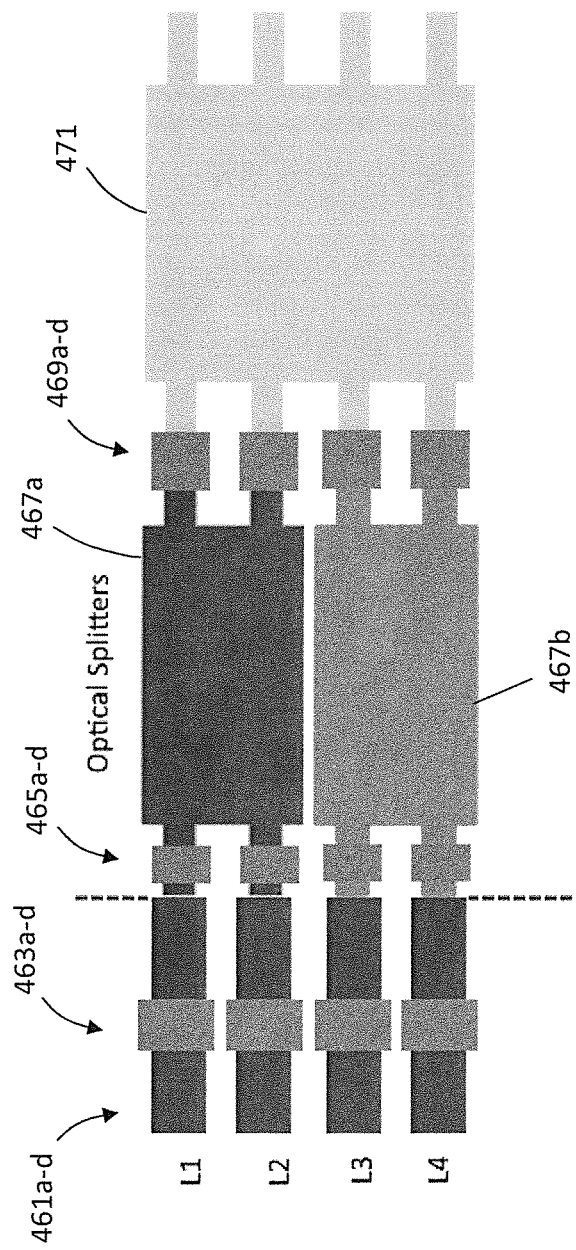

FIG. 4I schematically shows four lasers 461a-d providing light through a pair of splitters in accordance with aspects of the invention. In the embodiment of FIG. 4I, the first pair of lasers provide light to a first 2×2 optical splitter 467a, and a second two of the lasers provide light to a second 2×2 optical splitter 467b. Wavelength tuning elements 463a-d are associated with the lasers, with one wavelength tuning element associated with each laser. The wavelength tuning elements provide for tuning of wavelength of light emitted by the lasers. In addition, power tuning elements 465a-d and 469a-d are associated with the optical splitters. In FIG. 4I, the power tuning elements 465a-d are illustrated in optical pathways between the lasers and the splitters, and the power tuning elements 469a-d are illustrated at outputs of the optical splitters. In various embodiments, however, the power tuning elements may be implemented as part of construction of the power splitters.

Figure 4J:
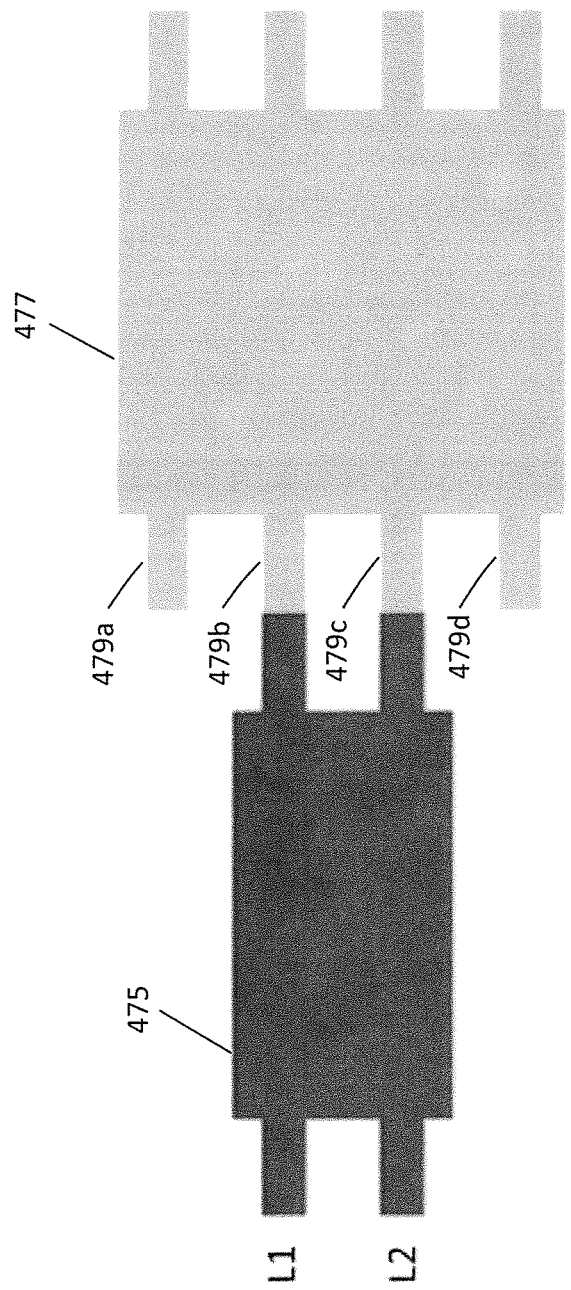

FIG. 4J schematically shows a 2×2 splitter 475 receiving light from two lasers and providing light to a 4×4 splitter 477. In the embodiment of FIG. 4J, the 4×4 splitter includes four inputs 479a-d, of which two inputs 479b,c receive light from corresponding outputs of the 2×2 splitter. The other two inputs 479a,d of the 4×4 splitter may be considered dummy inputs, as they are not coupled to light sources. In some embodiments, these dummy inputs may be absent, making this a 2×4 rather than a 4×4 splitter.

Figure 4K:
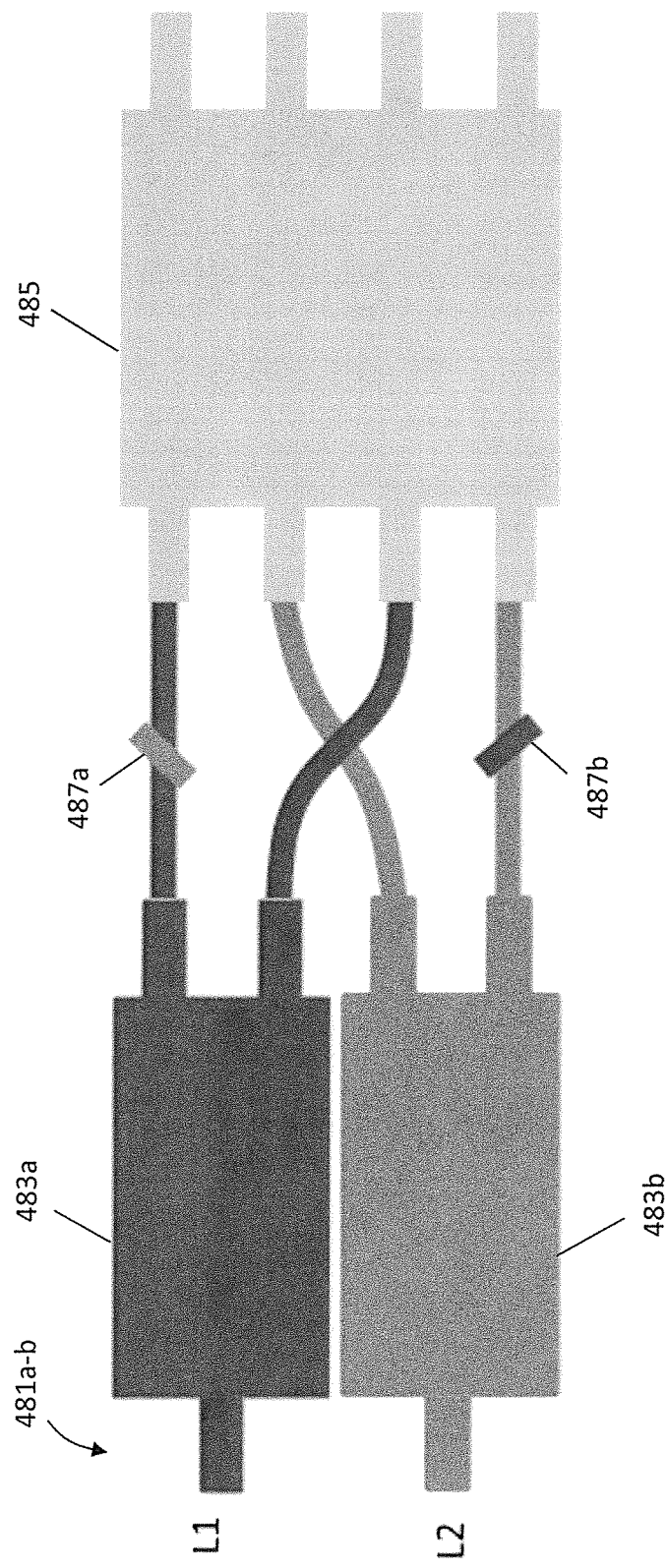

FIG. 4K diagrammatically shows a pair of 1×2 splitters 483a,b, each receiving light from one of two lasers and providing light to a 4×4 splitter 485. In the embodiment of FIG. 4K, power tuning elements 487a,b are shown in the optical pathways between one of the outputs of the first splitter 483a and the 4×4 splitter and between one of the outputs of the second splitter 483b and the 4×4 splitter, respectively.

Figure 4L:
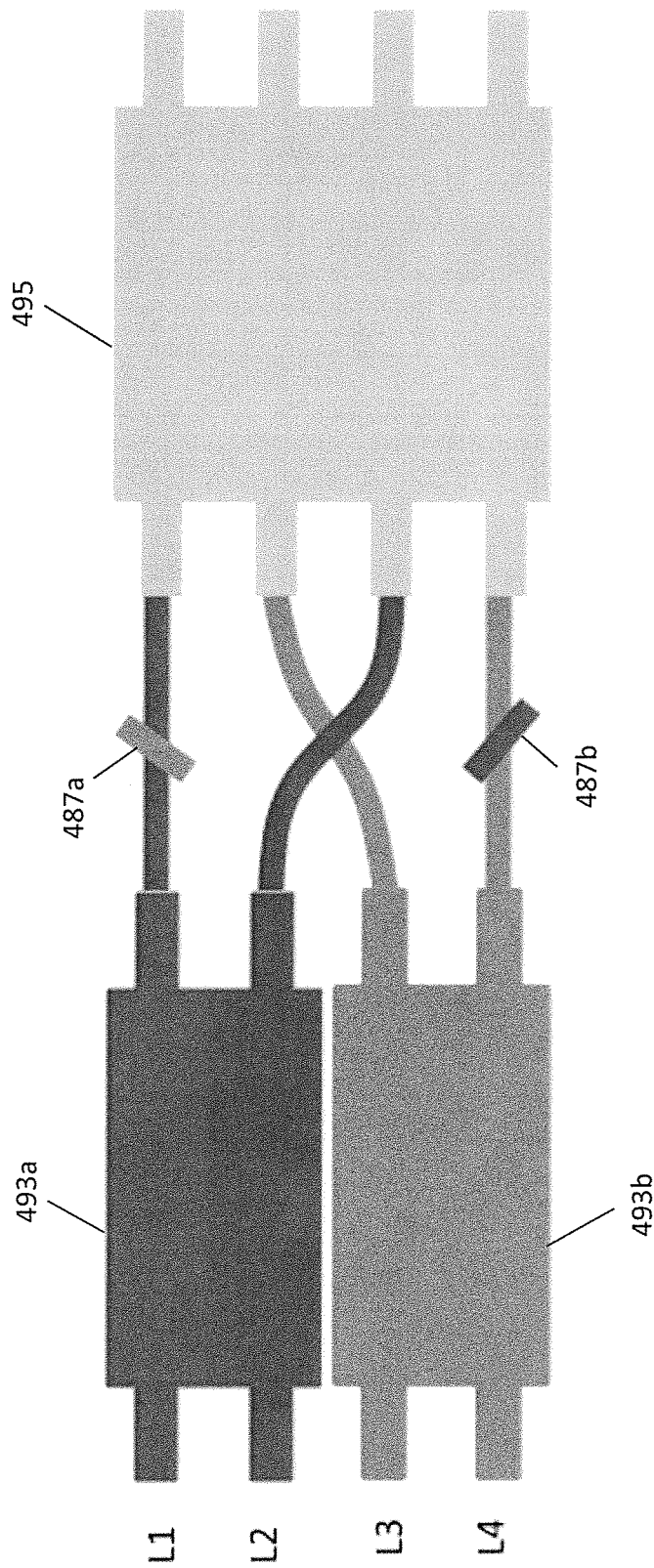

The embodiment of FIG. 4L is similar to that of FIG. 4K, but in FIG. 4L the 1×2 splitters are replaced by 2×2 splitters 493a,b, with four lasers providing light to the inputs of the 2×2 splitters. As in the embodiment of FIG. 4I, outputs of the 2×2 optical splitters are provided to a 4×4 splitter, with power tuning elements 487a,b provided in two of the optical pathways between the 2×2 splitters and the 4×4 splitter.

Figure 5:
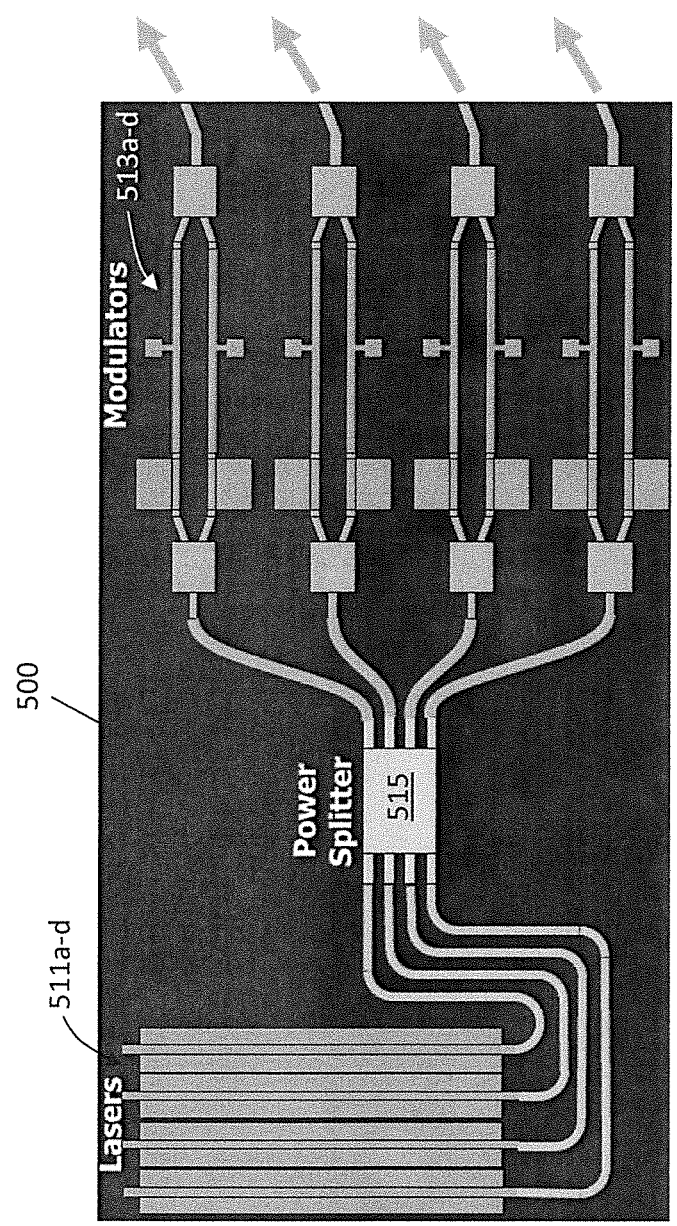
FIG. 5 is a further diagram of light sources integrated with modulators on a PIC, with the light sources oriented differently than the modulators, in accordance with aspects of the invention.

FIG. 5 is a further diagram of light sources integrated with modulators on a PIC in accordance with aspects of the invention. Referring to FIG. 5, a PIC 500 (e.g., InP chip) includes light sources 511a-d, which may include InP lasers in some embodiments, a splitter 515, and modulators 513a-d (e.g., Mach-Zehnder modulators). Each of the modulators may provide a 50 Gb/s optical signal. In some embodiments, there may be eight of the PICs in an architecture to provide for 32 wavelengths, for example, as shown in FIG. 3A-3B. In some embodiments, each of the light sources may provide light to the modulators, for example, through a splitter 515 (e.g., MMI coupler, star coupler).

As illustrated in FIG. 5, but which in various embodiments is also applicable to the light sources and modulators of FIGS. 4A-L, the light sources may be positioned so as to be oriented in a different direction on the PIC than the modulators, for example, perpendicular to the modulators. Such positioning or orientation, in some embodiments, may optimize the light sources and modulators, and may result in improved performance and reduced overall PIC size.

Figure 6:
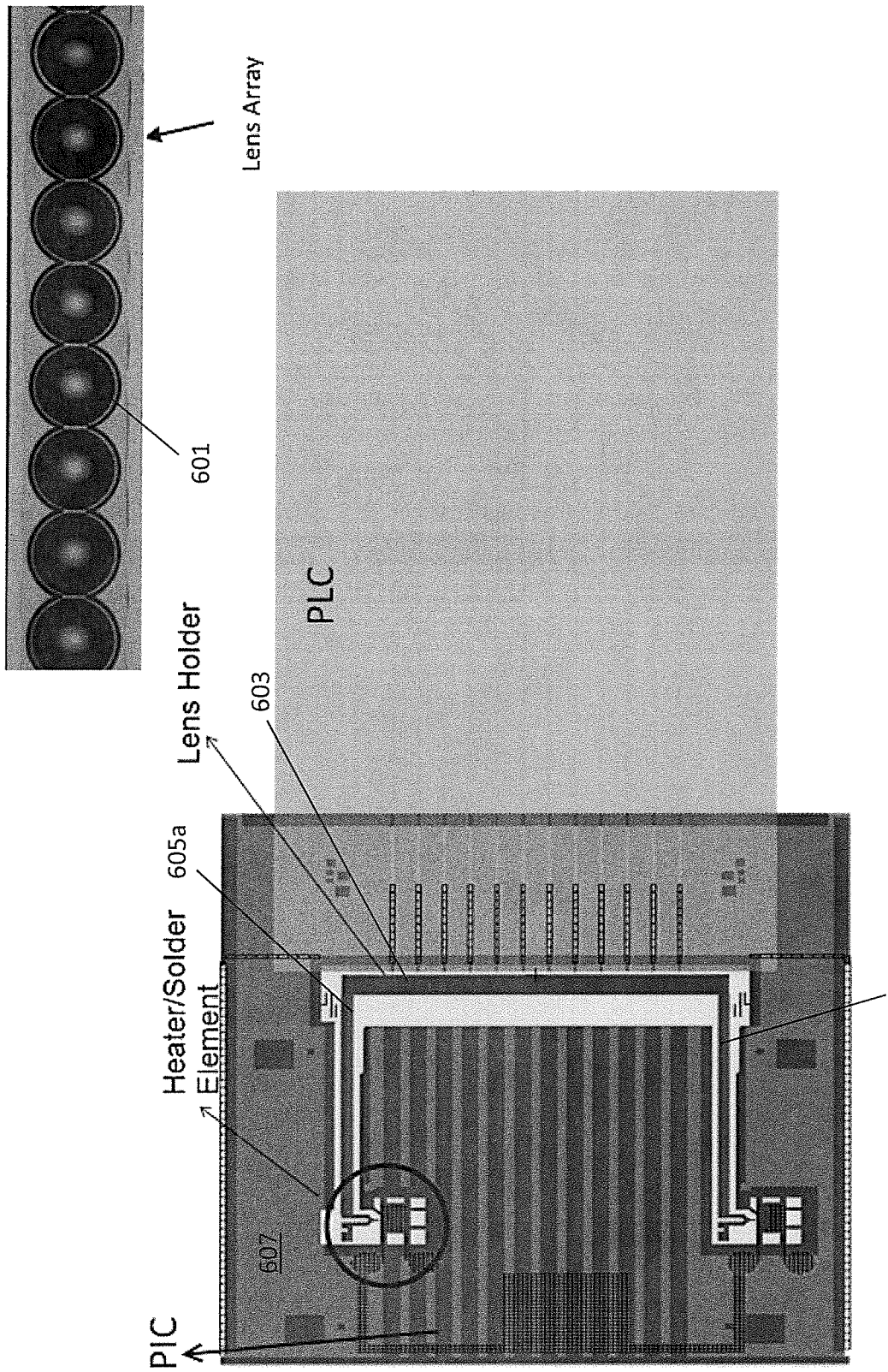
FIG. 6 illustrates a system that couples a photonics chip to laser arrays using MEMS coupling in accordance with aspects of the invention.

FIG. 6 illustrates a system that couples a laser array or PIC and PLC using MEMS coupling in accordance with aspects of the invention. The MEMS coupling, for example, may be the same as or similar to the MEMs device of, for example, U.S. Pat. No. 8,346,037 issued on Jan. 1, 2013 and entitled MICROMECHANICALLY ALIGNED OPTICAL ASSEMBLY, the disclosure of which is incorporated herein by reference for all purposes.

In FIG. 6, an array of lenses 601 may be made lithographically and attached to a movable stage 603, over a substrate 607 two adjustment arms 605a,b, extend from the movable stage. In the embodiment of FIG. 6, with one arm extends, in the same direction, from opposing ends of the movable stage. Adjustment of the arms allows for positioning of the movable stage in a position in which lights between the PIC to the PLC, or between the PLC and fiber optics lanes of an MTP connector. Once the adjustment arms on the two sides of the array have been manipulated to optimize optical alignment, the arms may be locked into place. For example, ends of the arms, distant from the movable stage, may include solder and, in some embodiments a heater element, for example a resistance heater. The solder may be included, for example using the heater, and, once locked onto the substrate, locking the arms in place.

Figure 7A:
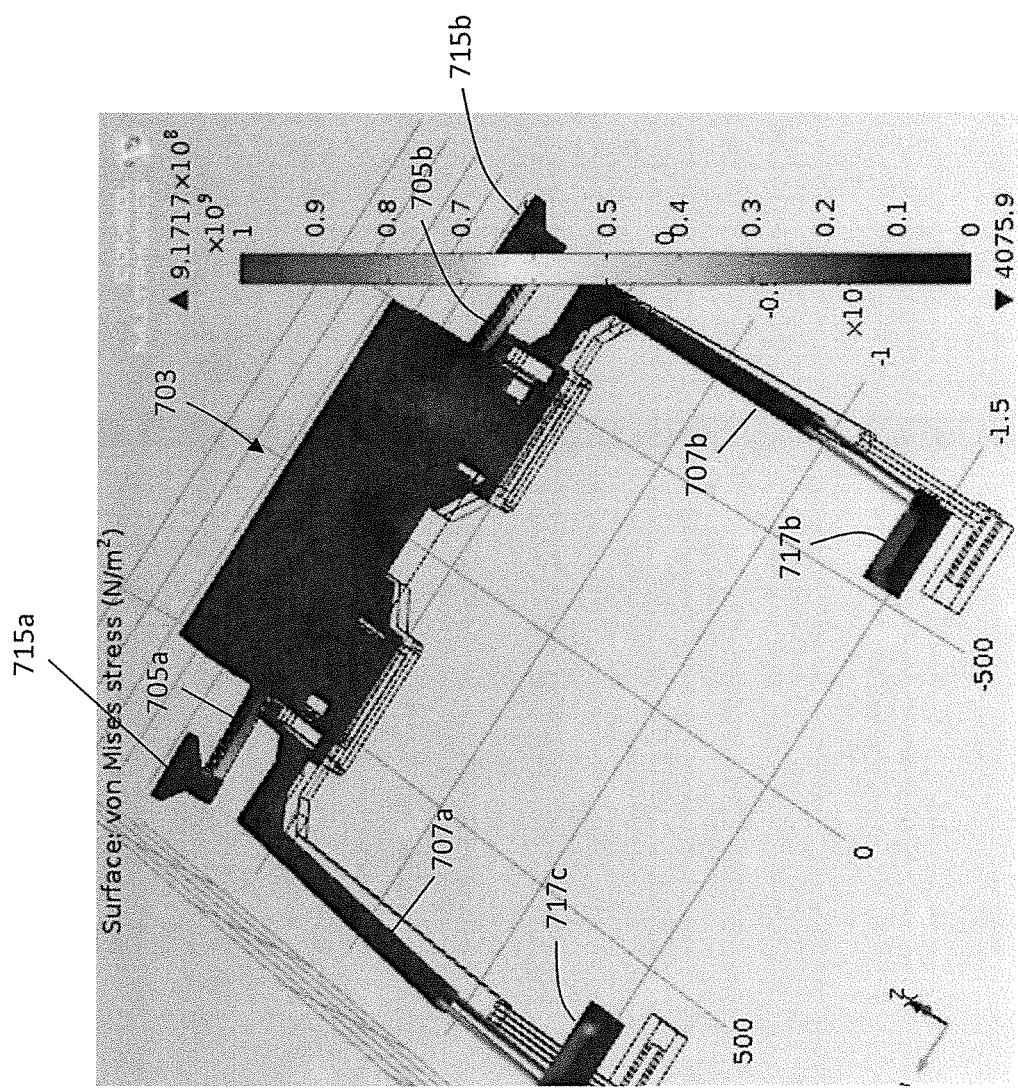
FIGS. 7A-C illustrate a MEMS structure for aligning an array of lenses in accordance with aspects of the invention.
Figures 7B, 7C:
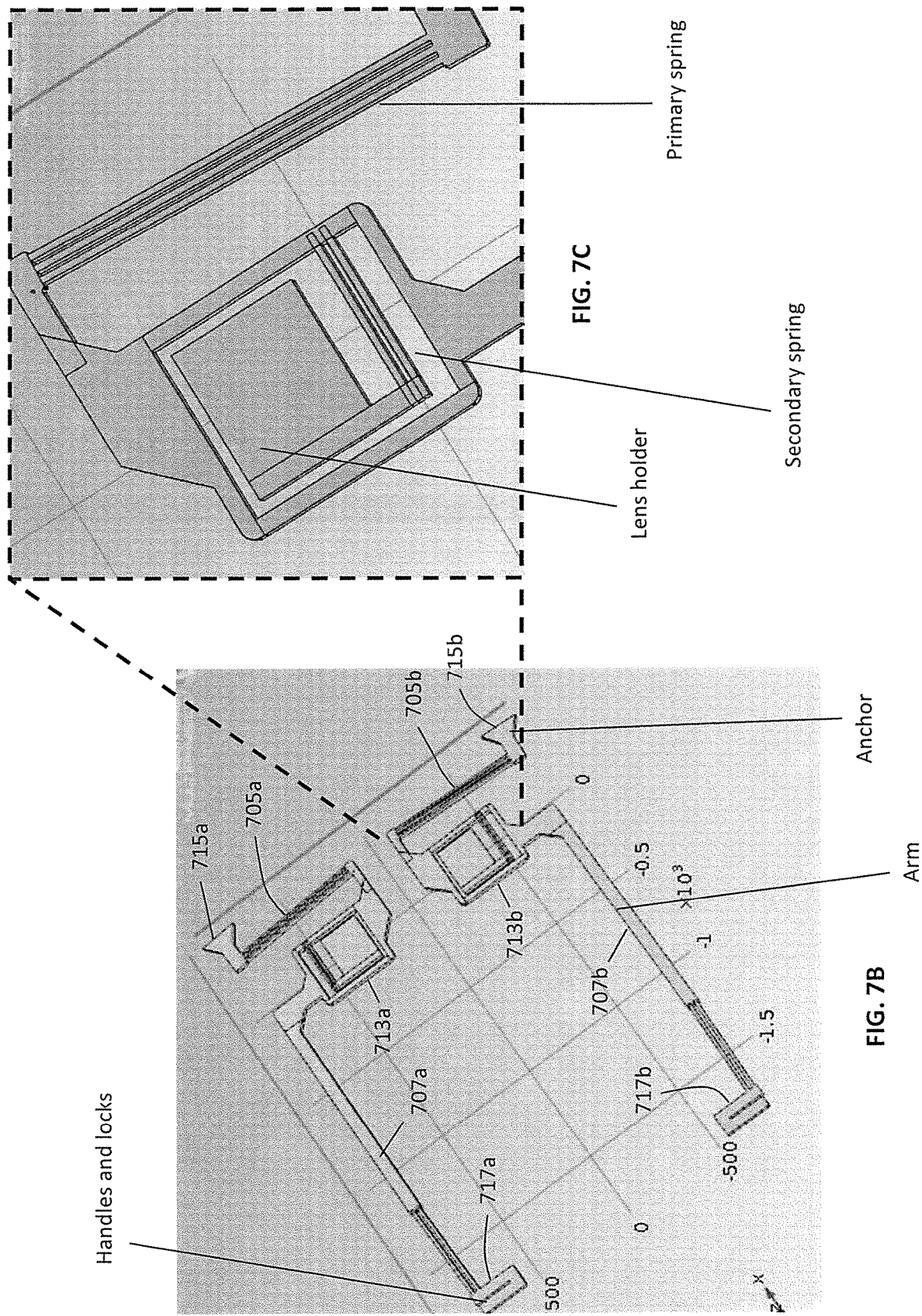

FIGS. 7A and B illustrate a MEMS for aligning an array of lenses in accordance with aspects of the invention. FIG. 7A shows the MEMS with the lens array in place 703, and FIG. 7B shows MEMS without the lens array, just the two platforms where the lens is mounted. Turning to FIG. 7A, the MEMS includes a lens array, a pair of torsion springs 705a,b extend from opposite sides of the movable structure, and, with a right angle forward bend, attach to a substrate (not shown) at 715a,b. These are the anchor points of the movable MEMS structure. A pair of adjustment arms 707a, b also extend from the opposing sides of the movable structure. The arms extend a short distance from the lens array to move the lens array attached on the holders, as illustrated in FIG. 7A, distant ends of the adjustment arms have handles 717a,b.

FIG. 7B shows the MEMs without the lens array, one end of the torsion spring 705a is attached to a first portion of a first pad 713a, the other end attached to the anchor point 715a connected to the substrate. To adjust the position of the platform 713 a, an adjustment arm 707a is connected to the other side of the platform from the torsion spring. This structure is repeated in a mirror reflection for a second movable platform 713b.

FIG. 7C shows the secondary spring used to release torsion stress when opposing arm is moved (FIG. 7 A/B—707a/b). In operation, to align the array of lenses (e.g., with light sources), the pair of arms 707a,b may be manipulated (e.g., using handles 717a,b) so as to move the two platforms 713a and 713b. When the alignment of the array of lenses is optimized, the handles 717a and 717b are locked in position, using a solder ball or other means. Note that the platforms 713a, b contain inner springs that allow the lens array some play, such that the arms can be adjusted independently.

Figure 8:
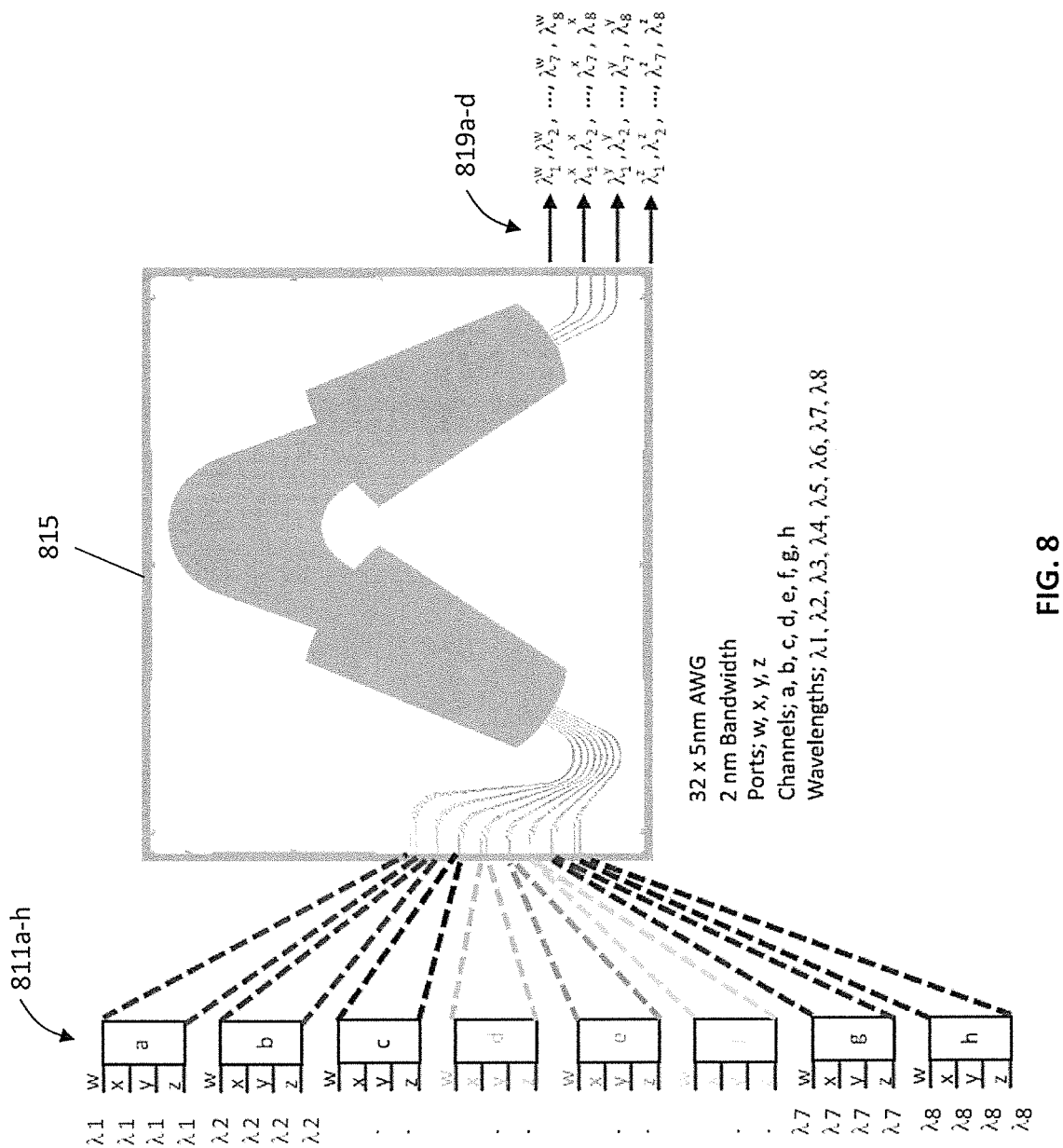
FIG. 8 illustrates an architecture having a single AWG routing of wavelengths in accordance with aspects of the invention.

FIG. 8 illustrates an architecture having a single AWG routing of wavelengths in accordance with aspects of the invention. As illustrated in FIG. 8, the architecture includes eight sets of four channels 811a-h. Each set of channels 811a, . . . 811h includes four optical signals, each of a common wavelength. For example, the first set of channels 811a may provide four optical signals, Wa, Xa, Ya, Za in light of a first wavelength; the second channel 811b may also provide four optical signals, Wb, Xb, Yb, Zb in light of a second wavelength; and so on. In some embodiments, light is considered at the same wavelength if within 2 nm band. Of course if a structure such as FIG. 4A is used, where only one laser is activated and the light distributed to four modulators, the light will be the same center wavelength exactly. Optical signals from each of the channels are passed to an AWG 815 (e.g., 32×5 nm AWG). The AWG multiplexes the optical signals into four output ports 819a-d, with each of the output ports receiving one optical signal from each of the channel sets 811a, . . . 811h. For example, the first output port 819a may receive the first signal, marked "w" in the figure from each of the channels sets, the second output port may receive the second, or the "x" signals from each of the channels sets, and so on. In this way, each output port may provide eight optical signals, each of a different wavelength. Such an AWG, though it is combining 8 bands of 4 wavelengths into four outputs, where the wavelength spacing between the bands is 20 nm, is internally identical to a design that combines 32 channels that are spaced 5 nm into a single output. In some ways it is advantageous to use a single high resolution AWG to multiplex all the channels, rather than using four separate lower resolution AWGs. The disadvantage of the latter approach would be the need for cross-overs between the waveguides.

The higher resolution AWG shown in FIG. 8 would ideally have a temperature dependence that matches that of the lasers coupled to it. In this way, as the temperature changes, the wavelengths of the AWG follow those of the sources. This can be realized using a "superthermal design," for example as discussed in U.S. patent application Ser. No. 14/281,561, entitled MULTIPLE WAVELENGTH LIGHT-SOURCE WITH TRACKING MULTIPLEXER, filed May 19, 2014, the disclosure of which is incorporated herein by reference for all purposes.

Figure 9:
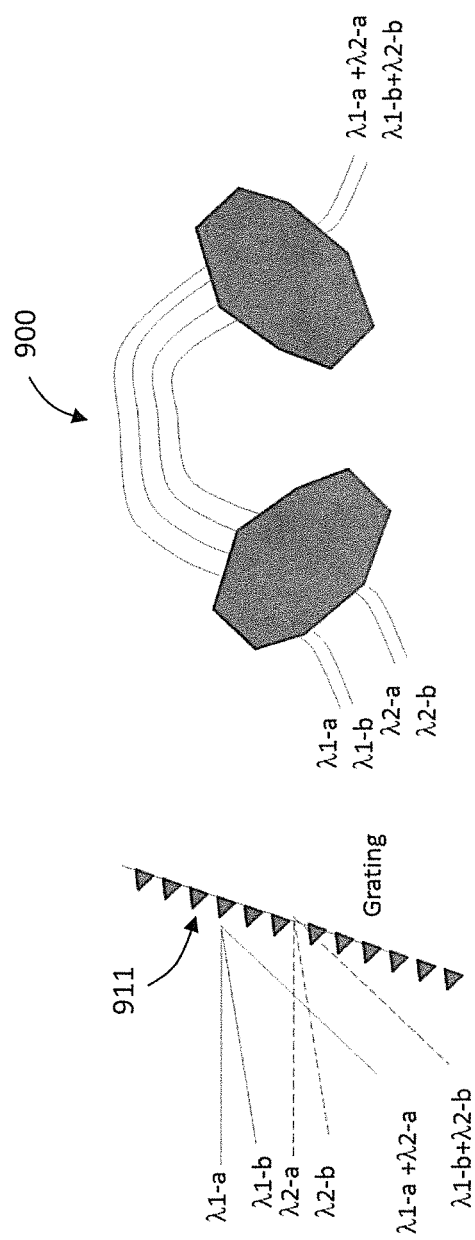
FIG. 9 illustrates a diffraction grating in accordance with aspects of the inventions.

FIG. 9 illustrates a diffraction grating in accordance with aspects of the inventions. Referring to FIG. 9, a multiplexing diffraction grating 900 (e.g., echelle grating) includes grooves 911 having a zigzag or step-like cross-sectional profile. The diffraction grating diffracts incoming light (e.g., from laser sources) using the grooves and multiplexes the light into one or more output waveguides. In some embodiments, the diffraction grating may be used in substitution of an AWG for multiplexing incoming light.

Figure 10A:
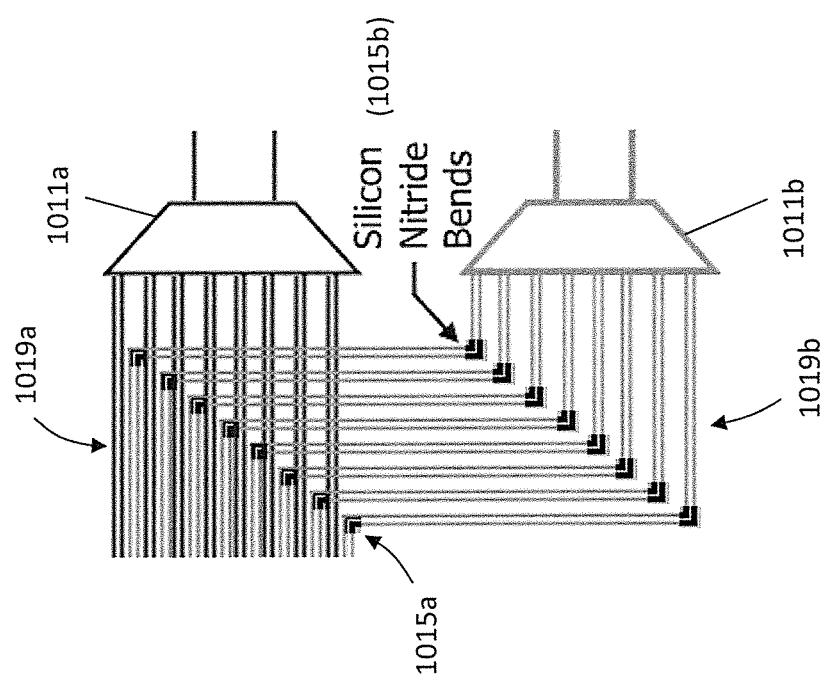

FIGS. 10A and B illustrate examples of multiplexer routing in accordance with aspects of the invention. Rather than using a single high resolution multiplexer, as discussed with respect to FIG. 8, one may use multiple lower resolution, e.g. wider bandwidth, multiplexers, with the disadvantage of having cross-overs. In FIG. 10A, multiplexers 1011a,b (e.g., 16×10 nm multiplexing AWGs) multiplex incoming light into multiplexer output waveguides 1019a,b respectively. Note that the light is coming from the sources on the left hand side of the figure and multiplexed into waveguides on the right hand side. As shown in FIG. 10A, the multiplexer input waveguides 1019b may be routed to an area or vicinity of the multiplexer input waveguides 1019a, such that the PICs that would be positioned at the input of the figure would generate light of the same wavelength from multiple adjacent sources. In the figure only two multiplexers are shown, but of course four could be used to match the topology of the previously discussed with respect to FIG. 8. The routing of the input waveguides 1019b includes bends 1015a,b in the waveguides to achieve desired routing. This leads to cross-overs. In some embodiments silicon nitride (SiN) material may be used in the bends 1015a,b (e.g., at 30, 45, 60, or 90 degrees angle bends) of the routed demultiplexer output waveguides 1019b. In some embodiments, use of silicon nitride in the bends may allow for reduced size of a bend radius, a more perpendicular cross-over geometry that has low loss and cross-talk and reduce footprint of the device. In some embodiments, the routing of waveguides (as discussed) may be applied to a different number of multiplexers as illustrated in FIG. 10B with four output fibers and 32 input sources, matching that of FIG. 8 Referring to FIG. 10B, multiplexers 1051a-d (e.g., 8×20 nm multiplexing AWGs) multiplex incoming light into multiplexer output waveguides 1051a-d respectively. The routing of the input waveguides 1059b-d includes bends 1055a-f in the waveguides. In some embodiments silicon nitride may be used in bends 1055a-f of the routed multiplexer input waveguides 1059b-d, thereby reducing size of a bend radius and reducing footprint of a device (e.g., a PLC) and the routed multiplexer input waveguides.

FIGS. 8-10 deal with the multiplexing of the sources into a reduced number of fibers. PICs with multiple sources are easy to make if the sources are of the same wavelength. PICS may become more challenging to produce if one attempts to integrate sources of very different wavelengths on the same chip. This is because each wavelength source ideally is of a different optical gain material. Thus, in some embodiments, one may end up with 8 PICs, with each PIC containing four sources of the same wavelength. Light from these sources is routed to four fibers with the wavelengths ordered, as previously discussed. On the demultiplexer, there is no issue. One can simply use four independent AWGs. The demultiplexed signals would not be ordered into bands in the same way, but this is not an issue as the electrical signals can be routed in any way desired in the TIA or the switch chip.

FIGS. 11A and B illustrate examples of optical connectors for coupling optical fibers to PLCs in accordance with aspects of the invention. As shown in FIG. 11A, an optical connector 1100 (e.g., an edge-coupled connector) includes a lens array 1113 having two rows of lenses with four lenses per row. The optical connector, for example, serves to form optical connections between PLCs (e.g., two vertically stacked or double stacked PLCs) and optical fibers by passing light between the PLCs and optical fibers. For the non-stacked configuration, the PLC would connect to a single layer connector or a regular fiber V-groove array (FVA) fibre attach.

In operation, the lens array serves to align and connect the optical fibers to the PLCs. For example, a top row of the lens array may focus incoming light from a plurality of first input optical fibers into input waveguides of a top PLC, and focus outgoing light from output waveguides of the top PLC into a plurality of first output optical fibers. Similarly, a bottom row of the lens array may focus incoming light from a plurality of second input optical fibers into input waveguides of a bottom PLC, and focus outgoing light from output waveguides of the bottom PLC into a plurality of second output optical fibers.

In some embodiments the PLCs may be four vertically stacked or quad stacked PLCs. For example, an optical connector having a lens array of four rows may be used to form optical connections between the PLCs and optical fibers. In FIG. 11B, an optical connector 1150 includes a lens array 1153 having four rows with four lenses per row. Similar to the optical connector 1100 of FIG. 11A, each row of the lens array is configured to focus incoming light from input optical fibers into input waveguides of a corresponding stacked PLC, and to focus outgoing light from output waveguides of the corresponding stacked PLC into output optical fibers.

FIGS. 12A and B illustrate side and top views respectively, of two vertically stacked or double stacked PLCs and an optical connector in accordance with aspects of the invention. Referring to FIGS. 12A and B, an optical connector 1200, which may be the optical connector 1100 of FIG. 11A, having a lens array 1233 is positioned to optically couple light to and from vertically stacked top PLC 1211 and bottom PLC 1221, with the top PLC positioned on top of the bottom PLC. In addition, in the embodiment of FIGS. 12A and B, the top PLC has a shorter length than the bottom PLC. Accordingly, the bottom PLC provides a mesa 1222 extending to a rear of the top PLC. A first row of the lens array may focus light to or from a plurality of first input optical fibers (not shown) into or out of waveguides of the top PLC, including an input waveguide 1215, with only a single input waveguide being diagrammatically shown for clarity. Light in the waveguide 1215 may be reflected by a first reflective element 1217 (e.g., a mirror) in the PLC into a photodetector 1213, which provides electrical signals to a first track 1219. In some embodiments the photodetector may be paired with a transimpedance amplifier (TIA), for example in a common package. The first track, in some embodiments, may include microstrip transmission lines for conveying electrical signals and be positioned on top or over the top PLC, for example on the mesa of the bottom PLC. Placement of the photodetector (or photodetector and TIA) on the PLC allows for reduced overall device footprint. Moreover, the transmission lines may be routed over other PLCs in the stack of PLCs, and such routing of the transmission lines may also allow for reduced overall device footprint. This approach not only applies to stacked demultiplexer chips, in another configuration, a single PLC can be used and have tracks on top of the PLC.

Similarly, a second row of the lens array may focus light to or from a plurality of second input optical fibers into or out of waveguides, including for example waveguide 1225, of the bottom PLC. Light in the waveguide 1225 may be reflected by a second reflective element 1227 within the bottom PLC into a photodetector 1223, which provide electrical signals to a second track 1229. The second track, in some embodiments, may include microstrip transmission lines for conveying electrical signals and be positioned on top or over the bottom PLC, which may or may not use VIAs.

Figure 12C:
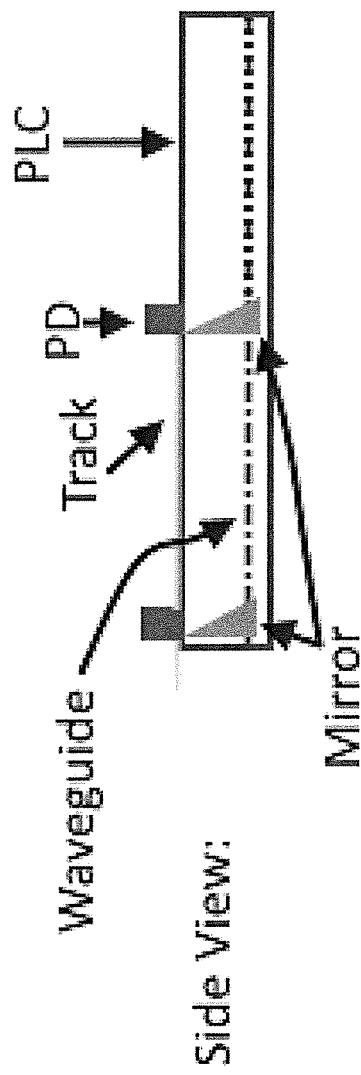
Figure 12D:
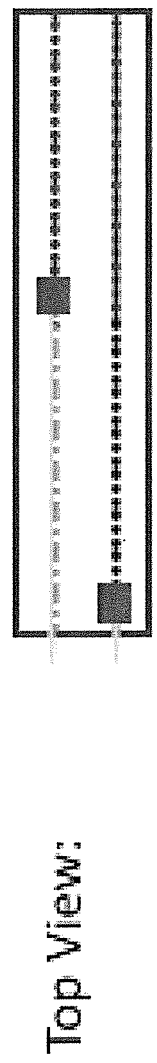

FIGS. 12C and D illustrate a side view and a top view of an alternative embodiment, where there is no vertically stacked PLC, but it is all planar, where the waveguides and turning mirrors are in the same PLC. The PDs are on top of the PLC at the turning mirrors, and the tracks connecting the PDs run on top of the planar PLC. This configuration has the light coupled to it from the OSA, in accordance with aspects of this invention, where the optical module may or may not use MTP connectors.

Figure 13:
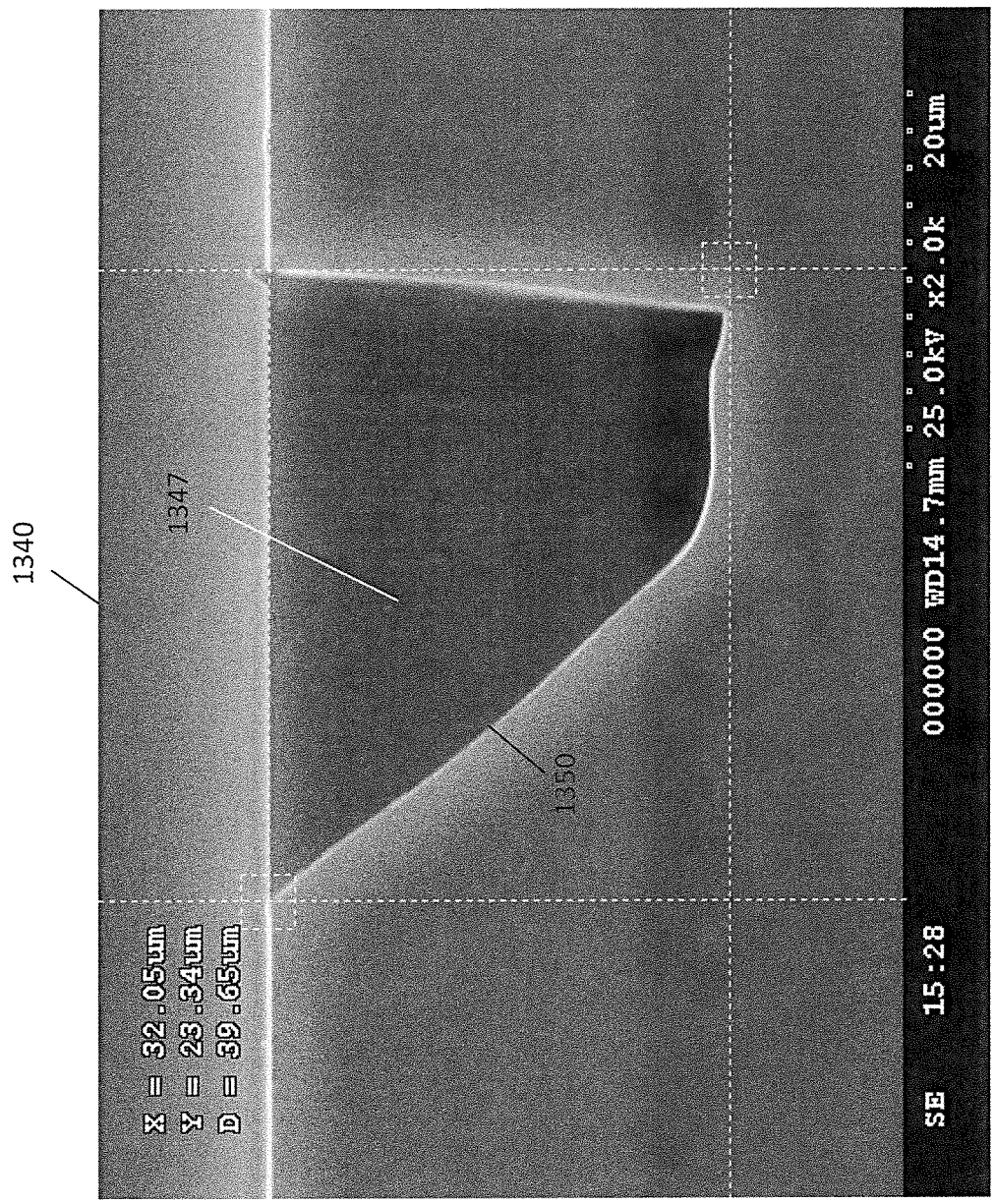
FIG. 13 illustrates a reflective element etched in a PLC in accordance with aspects of the invention.

FIG. 13 illustrates a reflective element etched in a PLC in accordance with aspects of the invention. As shown in FIG. 13, a PLC 1340 is etched to form a cavity 1347. The cavity or a portion thereof is polished at an angle so as to form a reflective element 1350 (e.g., an upturned mirror). The reflective element, for example, serves to deflect light from waveguides in the PLC into photodetectors.

Figure 14A:
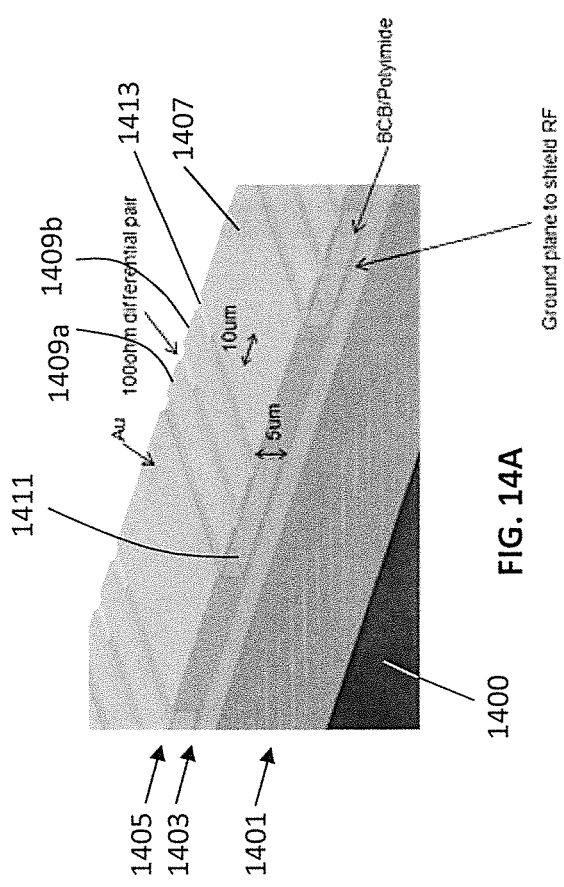
FIGS. 14A-D illustrate examples of signal tracking with respect to a PLC in accordance with aspects of the invention.
Figure 14B:
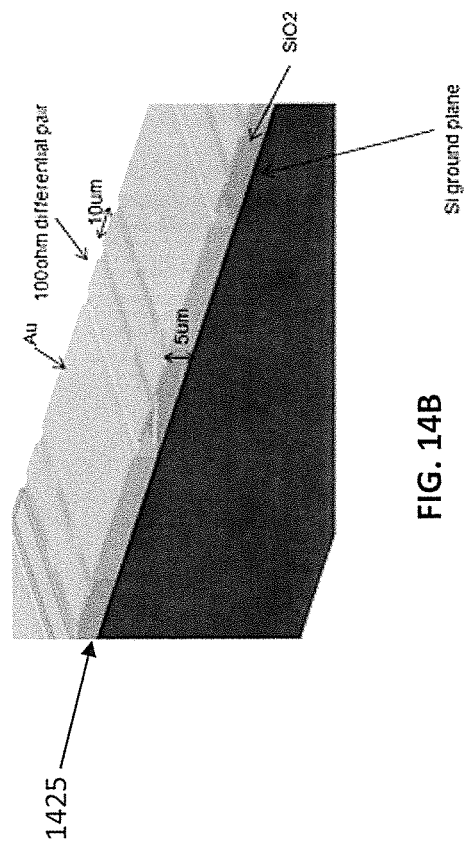

FIGS. 14A and B illustrate examples of signal tracks with respect to a PLC in accordance with aspects of the invention. Turning to FIG. 14A, a first layer 1401 (e.g., of silicon dioxide material) is deposited over a surface (e.g., an underside) of a PLC 1400. A second layer 1403 is deposited on top of the first layer, for example, to form a ground plane for shielding radio frequency (RF) signals from base material effects. A third layer 1405 is deposited on top of the second material, with the third layer including walls 1407 and open volumes 1411. The walls and open volumes are generally arranged so as any pair of the open volumes are isolated or separated by a wall. In some embodiments, the walls serve to improve channel to channel isolation. The walls and open volumes, for example, may be formed by etching of the third layer.

Figure 14C:
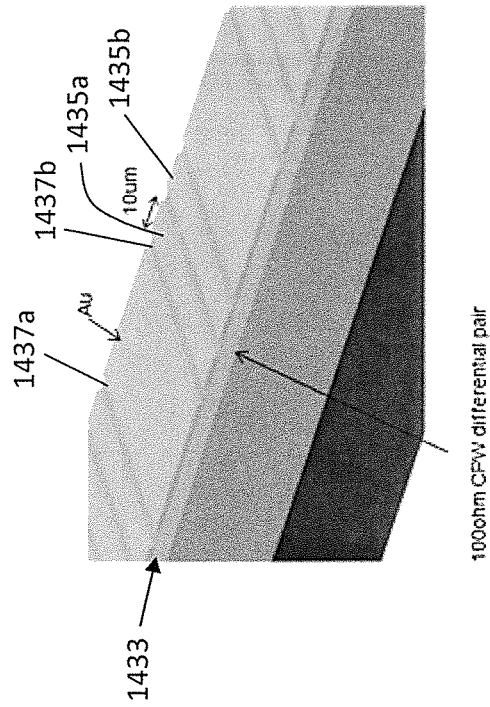

Turning to FIG. 14C, a coplanar waveguide (CPW) 1433 may be deposited on the PLC cladding. The CPW (e.g., 100 Ohm differential CPW) may convey electrical signals using conductors (e.g., conductors 1435a,b) separated by ground planes (e.g., ground planes 1437a,b).

Figure 14D:
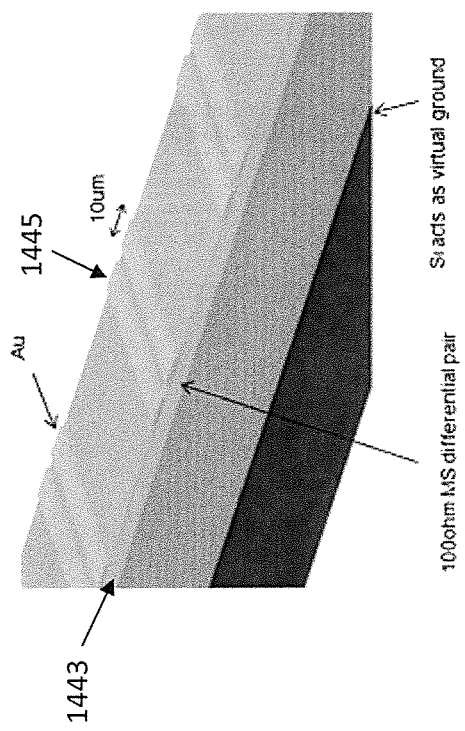

In FIG. 14D, microstrips 1443 are deposited on top of the first layer instead of the second layer as previously discussed. In this instance, the silicon substrate serves as a ground plane. The microstrips may convey electrical signals using conductors 1445.

Although the invention has been discussed with respect to various embodiments, it should be recognized that the invention comprises the novel and nonobvious claims supported by this disclosure.

What is claimed is:

1. A switch module, comprising:
    a switch integrated circuit (IC) chip including a switch for routing switch inputs to switch outputs of the switch IC chip;
    a photonic integrated circuit (PIC) comprising:
        a plurality of light sources for providing light;
        an optical splitter having a plurality of splitter inputs and splitter outputs for use in splitting light provided by each of the plurality of light sources to the plurality of splitter outputs; and
        a plurality of modulators for modulating light received from the plurality of splitter outputs of the optical splitter and for providing modulated optical signals;
    a planar lightwave circuit (PLC) optically coupled to the PIC and positioned to receive the modulated optical signals, the PLC configured to combine the modulated signals into a plurality of optical outputs;
    wherein outputs of the switch IC chip are coupled to the plurality of modulators.

2. The switch module of claim 1, wherein the PIC further comprises semiconductor optical amplifiers (SOAs), each of the SOAs coupled to one of the plurality of modulators and positioned along a path of the one of the plurality of modulators.

3. The switch module of claim 2, wherein each of the SOAs is positioned before or after the one of the plurality of modulators.

4. The switch module of claim 1, wherein the plurality of light sources are oriented perpendicular to the plurality of modulators.

5. The switch module of claim 1, wherein the PLC includes arrayed waveguide gratings (AWGs) and waveguides.

6. The switch module of claim 5, wherein the waveguides include bends, the bends comprising silicon nitride material.

7. The switch module of claim 1, wherein only one of the plurality of light sources is activated at any given time.

8. The switch module of claim 1, wherein the optical splitter is a multimode interference (MMI) coupler, or a star coupler.

9. The switch module of claim 1, wherein the plurality of light sources comprise lasers.

10. The switch module of claim 1, wherein the plurality of modulators comprise Mach-Zehnder, electro-absorption or plasma effect modulators.

11. The switch module of claim 1, wherein the plurality of light sources comprise redundant lasers.

12. The switch module of claim 1 further comprising microstrip lines routed along a surface of the PLC for conveying electrical signals from the PLC to a transimpedance amplifier (TIA).

13. The switch module of claim 1, wherein the coupling of the PLC to the PIC is performed using MEMS, the MEMS configured to hold and align an array of lenses and including a holder for holding the array of lenses, the holder coupled to first, second, third, and fourth adjustment arms.

14. The switch module of claim 13, wherein the first and second arms are manipulable so as to move the holder about an x-axis and the third and fourth arms are manipulable so as to move the holder about a y-axis.

15. The switch module of claim 1, wherein the optical splitter splits the light provided by each of the plurality of light sources to a splitter output for each of the plurality of modulators.

16. A switch module, comprising:
a plurality of photonic integrated circuit (PICs), each of the PICs comprising:
  a plurality of light sources for generating light,
  an optical splitter having splitter inputs and splitter outputs and configured to split light generated by each of the plurality of light sources, and
  a plurality of modulators, with each of the plurality of modulators configured to modulate light provided by one of the splitter outputs to generate a modulated optical signal;
a plurality of stacked planar lightwave circuit (PLCs) optically coupled to the PICs,
wherein each PLC is configured to combine modulated optical signals from the plurality of modulators into an optical signal,
wherein a first length of a first PLC of the plurality of stacked PLCs is greater than a second length of a second PLC of the plurality of stacked PLCs, and
wherein the second PLC is stacked on top of the first PLC.

17. The switch module of claim 16 further comprising an optical connector for forming optical connections between the plurality of stacked PLCs and optical fibers, the optical connector including a lens array having a plurality of rows and configured to pass light between the plurality of stacked PLCs and the optical fibers.

18. The switch module of claim 17, wherein the plurality of stacked PLCs consist of two vertically stacked PLCs and the lens array includes two rows of lenses with four lenses per row.

19. The switch module of claim 17, wherein the plurality of stacked PLCs are four vertically stacked PLCs and the lens array includes four rows of lenses with four lenses per row.

20. The switch module of claim 19, wherein the microstrip or CPW transmission lines include 32 transmission lines.

21. The switch module of claim 16, wherein a surface of each of the plurality of stacked PLCs is coupled to microstrip or coplanar waveguide (CPW) transmission lines, the microstrip or CPW transmission lines configured to convey electrical signals from each of the PLCs to a transimpedance amplifier (TIA).

22. The switch module of claim 16, wherein the first PLC comprises a first photodetector positioned on top of the first PLC and the second PLC comprises a second photodetector positioned on top of the second PLC, wherein the first photodetector and the second photodetector are not stacked above one another.

23. The switch module of claim 16, wherein the second PLC comprises a track for conveying an electrical signal, and wherein the track is positioned over a top surface of the first PLC to an edge of the first PLC.

* * * * *